United States Patent
Zhang et al.

(10) Patent No.: US 12,051,699 B2
(45) Date of Patent: Jul. 30, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventors: Kui Zhang, Hefei (CN); Xin Li, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 365 days.

(21) Appl. No.: 17/520,794

(22) Filed: Nov. 8, 2021

(65) Prior Publication Data

US 2022/0310604 A1    Sep. 29, 2022

Related U.S. Application Data

(63) Continuation of application No. PCT/CN2021/111900, filed on Aug. 10, 2021.

(30) Foreign Application Priority Data

Mar. 29, 2021    (CN) .......................... 202110336238.1

(51) Int. Cl.
*H01L 27/092*    (2006.01)
*H01L 21/8238*    (2006.01)
(Continued)

(52) U.S. Cl.
CPC .. *H01L 27/0924* (2013.01); *H01L 21/823807* (2013.01); *H01L 21/823821* (2013.01);
(Continued)

(58) Field of Classification Search
CPC ......... H01L 27/0924; H01L 21/823807; H01L 21/823821; H01L 29/0669; H01L 29/785;
(Continued)

(56) References Cited

U.S. PATENT DOCUMENTS

| 7,244,643 B2 | 7/2007 | Ishitsuka |
| 7,723,807 B2 | 5/2010 | Nishiyama |

(Continued)

FOREIGN PATENT DOCUMENTS

| CN | 1592969 A | 3/2005 |
| CN | 101090121 A | 12/2007 |

(Continued)

OTHER PUBLICATIONS

"Will CFETs be the transistor of choice in the future?", May 2020, Semiconductor Industry Watch, Reprinted from the Internet at: http://www.semiinsights.com/s/electronic_components/23/39416.shtml, May 28, 2020, 10 pgs.

*Primary Examiner* — Karen Kusumakar
*Assistant Examiner* — Adam S Bowen
(74) *Attorney, Agent, or Firm* — Kilpatrick Townsend & Stockton LLP

(57) ABSTRACT

A semiconductor structure includes a base and a conductive channel structure, in which the conductive channel structure includes a base and a conductive channel structure which includes a first conductive channel layer including a first conductive channel, and a first and a second doped regions respectively located at two ends of the first conductive channel, a second conductive channel layer including a second conductive channel, and a third and a fourth doped regions respectively located at two ends of the second conductive channel and a conductive buffer layer configured to reduce electrical interference between the first and the third doped regions; a first conductive layer in contact with the second doped region; a second conductive layer nested on the conductive channel structure and in contact with the first and the third doped regions; and a gate structure arranged around the first conductive channel and the second conductive channel.

19 Claims, 30 Drawing Sheets

(51) Int. Cl.
   *H01L 29/06*   (2006.01)
   *H01L 29/78*   (2006.01)
(52) U.S. Cl.
   CPC ........ *H01L 29/0669* (2013.01); *H01L 29/785* (2013.01); *H01L 2029/7858* (2013.01)
(58) Field of Classification Search
   CPC ....... H01L 2029/7858; H01L 29/78642; H01L 21/823487; H01L 21/823814; H01L 21/823871; H01L 21/823878; H01L 21/823885; H01L 27/092
   See application file for complete search history.

(56) References Cited

U.S. PATENT DOCUMENTS

| | | | |
|---|---|---|---|
| 7,906,435 | B2 | 3/2011 | Nishiyama |
| 8,036,036 | B2 | 10/2011 | Nishiyama |
| 8,878,279 | B2 | 11/2014 | Koval |
| 9,196,625 | B2 | 11/2015 | Koval |
| 9,443,864 | B2 | 9/2016 | Koval |
| 9,472,551 | B2 | 10/2016 | Oxland |
| 9,698,022 | B2 | 7/2017 | Koval |
| 9,831,131 | B1 | 11/2017 | Jacob |
| 9,953,882 | B2 | 4/2018 | Jacob |
| 9,997,463 | B2 | 6/2018 | Zhang |
| 10,049,946 | B2 | 8/2018 | Oxland |
| 10,115,438 | B2 | 10/2018 | Ingalls et al. |
| 10,115,641 | B2 | 10/2018 | Zhu |
| 10,339,985 | B2 | 7/2019 | Ingalls et al. |
| 10,580,464 | B2 | 3/2020 | Ingalls et al. |
| 10,629,538 | B2 | 4/2020 | Zhang |
| 10,944,012 | B2 | 3/2021 | Reznicek et al. |
| 11,081,484 | B2 | 8/2021 | Zhu et al. |
| 11,081,546 | B2 | 8/2021 | Li et al. |
| 2005/0121727 | A1 | 6/2005 | Ishitsuka |
| 2007/0290232 | A1 | 12/2007 | Nishiyama |
| 2010/0027338 | A1 | 2/2010 | Nishiyama |
| 2010/0203728 | A1 | 8/2010 | Nishiyama |
| 2014/0160841 | A1 | 6/2014 | Koval |
| 2015/0187785 | A1 | 7/2015 | Koval |
| 2015/0364486 | A1 | 12/2015 | Koval |
| 2016/0240533 | A1 | 8/2016 | Oxland |
| 2017/0005106 | A1 | 1/2017 | Zhang |
| 2017/0011928 | A1 | 1/2017 | Koval |
| 2017/0033021 | A1* | 2/2017 | Oxland ........... H01L 21/823828 |
| 2018/0061460 | A1 | 3/2018 | Ingalls et al. |
| 2018/0090387 | A1* | 3/2018 | Jacob .............. H01L 21/823807 |
| 2018/0096896 | A1 | 4/2018 | Zhu |
| 2018/0097065 | A1 | 4/2018 | Zhu |
| 2018/0097106 | A1 | 4/2018 | Zhu |
| 2018/0108577 | A1 | 4/2018 | Zhu et al. |
| 2018/0294015 | A1 | 10/2018 | Ingalls et al. |
| 2018/0337133 | A1 | 11/2018 | Zhang |
| 2019/0287579 | A1 | 9/2019 | Ingalls et al. |
| 2019/0287865 | A1 | 9/2019 | Zhu et al. |
| 2019/0378854 | A1 | 12/2019 | Lee et al. |
| 2020/0203343 | A1 | 6/2020 | Zhu et al. |
| 2020/0212226 | A1 | 7/2020 | Reznicek et al. |
| 2020/0280700 | A1 | 9/2020 | Zhu |
| 2020/0335581 | A1 | 10/2020 | Li et al. |
| 2020/0350326 | A1 | 11/2020 | Yun et al. |
| 2021/0036146 | A1 | 2/2021 | Zhou |
| 2021/0296316 | A1 | 9/2021 | Zhu |
| 2021/0305364 | A1 | 9/2021 | Li et al. |

FOREIGN PATENT DOCUMENTS

| | | |
|---|---|---|
| CN | 105895635 A | 8/2016 |
| CN | 106252352 A | 12/2016 |
| CN | 106298792 A | 1/2017 |
| CN | 106449596 A | 2/2017 |
| CN | 109196584 A | 1/2019 |
| CN | 109449158 A | 3/2019 |
| CN | 109830483 A | 5/2019 |
| CN | 109841675 A | 6/2019 |
| CN | 110808247 A | 2/2020 |
| CN | 111883534 A | 11/2020 |
| CN | 112309860 A | 2/2021 |
| CN | 112310042 A | 2/2021 |
| CN | 113078154 A | 7/2021 |
| CN | 113078155 A | 7/2021 |
| CN | 113078156 A | 7/2021 |
| JP | 2007059680 A | 3/2007 |
| JP | 2007250652 A | 9/2007 |

\* cited by examiner

SEMICONDUCTOR STRUCTURE AND METHOD FOR FORMING SAME

CROSS-REFERENCE TO RELATED APPLICATIONS

This application is a continuation application of International Application No. PCT/CN2021/111900, filed on Aug. 10, 2021, which claims priority to Chinese Patent Application No. 202110336238.1, filed on Mar. 29, 2021. The disclosures of International Application No. PCT/CN2021/111900 and Chinese Patent Application No. 202110336238.1 are hereby incorporated by reference in their entireties.

BACKGROUND

The process and performance of an integrated circuit chip are closely related to the structure of a transistor device. The defects of a metal oxide semiconductor (MOS) field effect transistor device based on the PN junction theory are increasingly apparent when the technology node is 5 nm or less. The channel length of such device is continuously reduced, and the spacing between a source and a drain is increasingly closer. In order to prevent source-drain punch-through, the industry generally adopts a doping process with a ultra-steep gradient of source-drain concentration, which severely limits the thermal budget of the device manufacturing process. In addition, due to statistical distribution of doped atoms and the natural property that the doped atoms easily diffuse at a certain temperature, an ultra-steep PN junction is difficult to be manufactured in a nanoscale range. A serious short channel effect is generated, consequently, the threshold voltage of transistors is reduced, the gate control capability of the device becomes poor, the leakage current is increased, the power consumption is increased, and in severe cases, the device even may not be turned off.

One or more pairs of nFET and pFET cylindrical nanowire or nanosheet (or nanoribbon) channels are vertically crossed and stacked to form a device structure of Complementary Full-surrounding gate cylindrical nanowire or nanosheet (or nanoribbon) field Effect Transistor (CFET). In the CFET device structure, an nFET and a pFET share a gate electrode as a signal input end and share a drain electrode as a signal output end, and a source electrode is grounded and connected with a power supply. The size of the device may be flexibly adjusted to meet performance requirements of different chips. While the electric integrity of the vertically stacked nanowire or nanosheet (or nanoribbon) FET is kept, the area occupied by the chip is greatly saved, the driving current of the device is enhanced, and the integration level of the chip device is improved.

With the CFET, the device driving current is enhanced, the chip area of the chip is greatly saved at the same time, and the integration level of the chip devices is improved. However, because the pFET and the nFET share one source electrode or drain electrode connecting line and the preparation process is complex, variable and difficult to control, the nFET or the pFET at present adopts a horizontally placed GAA transistor, in which the horizontally placed conductive channel occupies a large area in the horizontal direction, so that the development of the CFET is limited.

SUMMARY

The disclosure relates, but is not limited, to a semiconductor structure and a method for forming the semiconductor structure.

Embodiments of the disclosure provides a semiconductor structure, which includes a base, a conductive channel structure located on the base, a first conductive layer, a second conductive layer and a gate structure. The conductive channel structure includes sequentially stacked a first conductive channel layer, a conductive buffer layer and a second conductive channel layer. The first conductive channel layer includes a first conductive channel, and a first doped region and a second doped region which are respectively located at two ends of the first conductive channel, in which, the first doped region is close to the second conductive channel layer. The second conductive channel layer includes a second conductive channel, and a third doped region and a fourth doped region which are respectively located at two ends of the second conductive channel, in which the third doped region is close to the first conductive channel layer. The conductive buffer layer is configured to reduce electrical interference between the first doped region and the third doped region. The first conductive layer is located on the base and is in contact with the second doped region. The second conductive layer is nested on the conductive channel structure and is in contact with the first doped region and the third doped region. The gate structure is arranged around the first conductive channel and the second conductive channel.

The embodiments of the disclosure further provide a method for forming a semiconductor structure. The forming method includes the following operations. A base including a structural region and a connecting line region is provided, in which the base includes a substrate, a first conductive layer and an isolation layer. A first sacrificial layer is formed on the base of the structural region, and a peripheral insulation structure is formed on the base of the connecting line region. The first sacrificial layer is patterned to form a first channel penetrating through the first sacrificial layer. A second conductive layer filling the first channel and covering the first sacrificial layer is formed, and the second conductive layer extends into the peripheral insulation structure of the connecting line region. A second sacrificial layer and a protective layer are sequentially formed on the base of the structural region. The second sacrificial layer is patterned to form a second channel penetrating through the second sacrificial layer, in which projections of the first channel and the second channel on the base coincide. A second conductive channel layer filling the second channel is formed. Part of the protective layer is patterned until the second sacrificial layer is exposed, and the second sacrificial layer is removed. Part of the second conductive layer is patterned until the first sacrificial layer is exposed. The first sacrificial layer is removed; and a gate structure filling gaps is formed.

The embodiments of the disclosure further provide a method for forming a semiconductor structure. The forming method includes the following operations. A base including a structural region and a connecting line region is provided, in which the base includes a substrate, a first conductive layer and an isolation layer. A first sacrificial layer is formed on the base of the structural region, and a peripheral insulation structure is formed on the base of the connecting line region. A second conductive layer is formed on the first sacrificial layer, in which the second conductive layer extends into the peripheral insulation structure of the connecting line region. A second sacrificial layer and a protective layer are sequentially formed on the base of the structural region. The protective layer, the second sacrificial layer, the second conductive layer and the first sacrificial layer are patterned to form an opening, and the opening is filled to form a conductive channel structure. Part of the protective layer is patterned until the second sacrificial layer is exposed, and the second sacrificial layer is removed. Part of the second conductive layer is patterned until the first sacrificial layer is exposed, and the first sacrificial layer is removed. A gate structure filling gaps is formed.

DETAILED DESCRIPTION

While enhancing the device drive current, the CFET greatly saves chip area and improves the integration of chip devices. However, because a pFET and an nFET share one source electrode or drain electrode connecting line and the preparation process is complex, variable and difficult to control, the nFET or the pFET at present adopts horizontally-arranged GAA transistors, in which horizontally-arranged conductive channels occupy a large area in the horizontal direction, so that the development of the CFET is limited.

In order to solve the problems, an embodiment of the disclosure provides a semiconductor structure, which includes a base, a conductive channel structure located on the base, a first conductive layer, a second conductive layer and a gate structure. The conductive channel structure includes sequentially stacked a first conductive channel layer, a conductive buffer layer and a second conductive channel layer. The first conductive channel layer includes a first conductive channel, a first doped region and a second doped region which are respectively located at two ends of the first conductive channel, in which, the first doped region is close to the second conductive channel layer. The second conductive channel layer includes a second conductive channel, a third doped region and a fourth doped region which are respectively located at two ends of the second conductive channel, in which the third doped region is close to the first conductive channel layer. The conductive buffer layer is configured to reduce electrical interference between the first doped region and the third doped region. The first conductive layer is located on the base and is in contact with the second doped region. The second conductive layer is nested on the conductive channel structure and is in contact with the first doped region and the third doped region. The gate structure is arranged around the first conductive channel and the second conductive channel.

In order to make the purposes, technical solutions and advantages of embodiments of the disclosure clearer, the embodiments of the disclosure will be described in detail below in combination with the accompanying drawings. However, it should be understood by those of ordinary skill in the art that, in the embodiments of the disclosure, numerous technical details are set forth in order to enable a reader to better understand the disclosure. However, the technical solutions claimed in the disclosure may be implemented even without these technical details and various changes and modifications based on the following embodiments. The following divisions of the embodiments are for convenience of description and are not to be construed as limiting the specific implementation modes of the disclosure, and the embodiments may be combined with and referenced to each other without contradiction.

Figure 1:
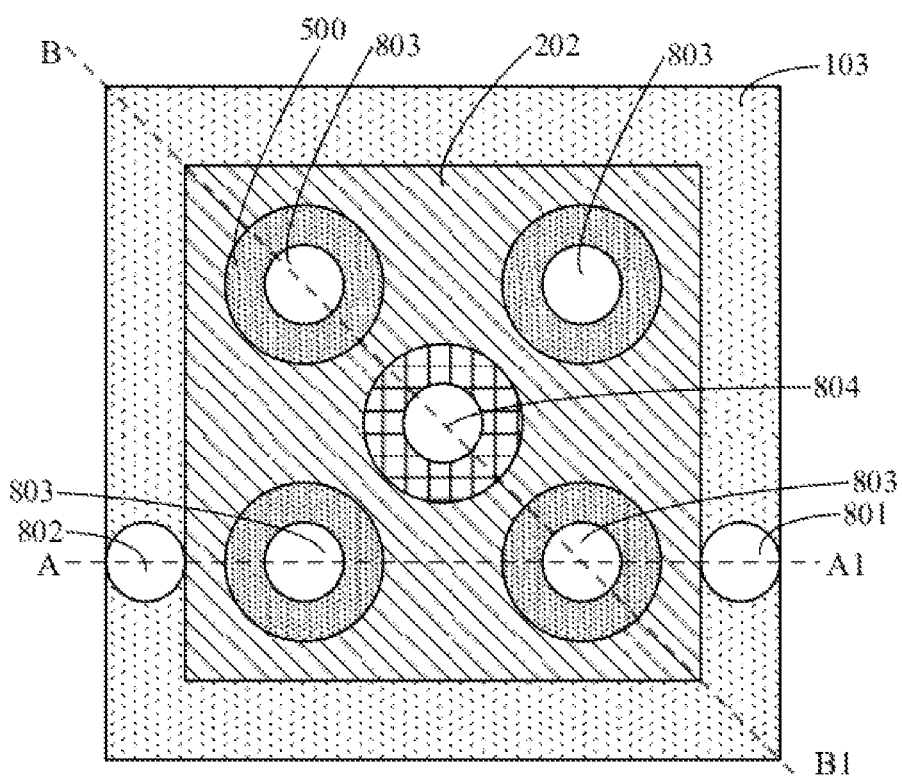
FIG. 1 is a schematic cross-sectional view of a semiconductor structure according to an embodiment of the disclosure.
Figure 2:
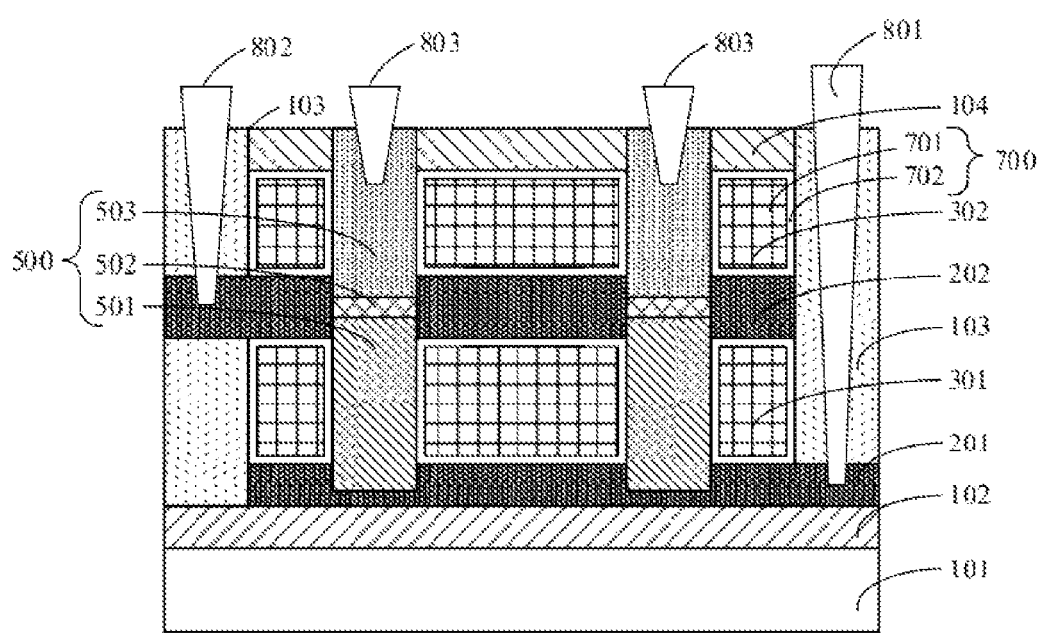
FIG. 2 is a schematic cross-sectional view of a semiconductor structure in an AA1 direction according to an embodiment of the disclosure.
Figure 3:
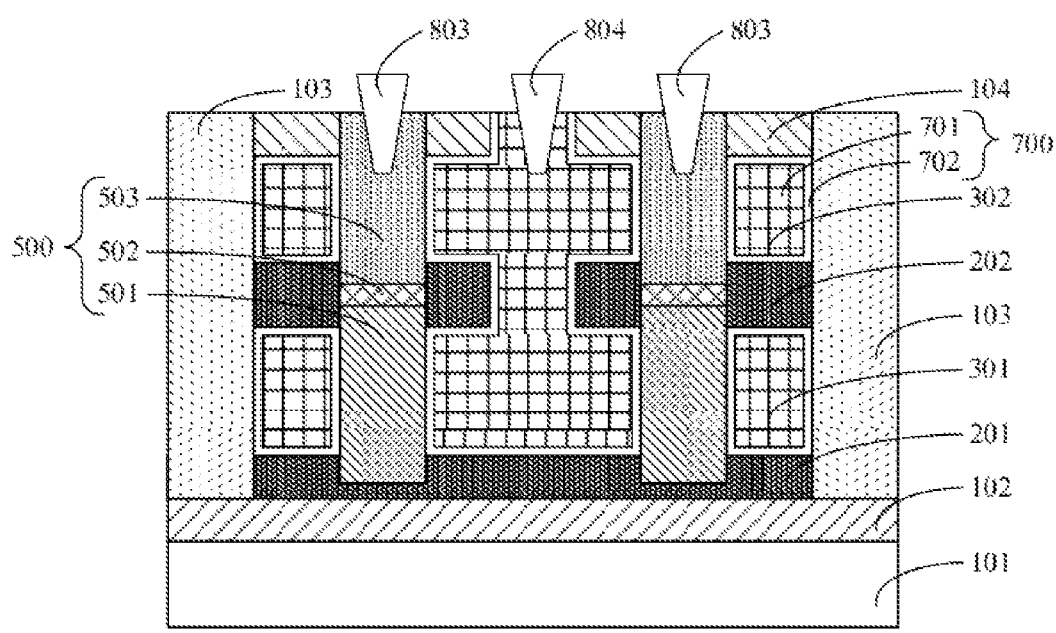
FIG. 3 is a schematic cross-sectional view of a semiconductor structure in a BB1 direction according to an embodiment of the disclosure.
Figure 4:
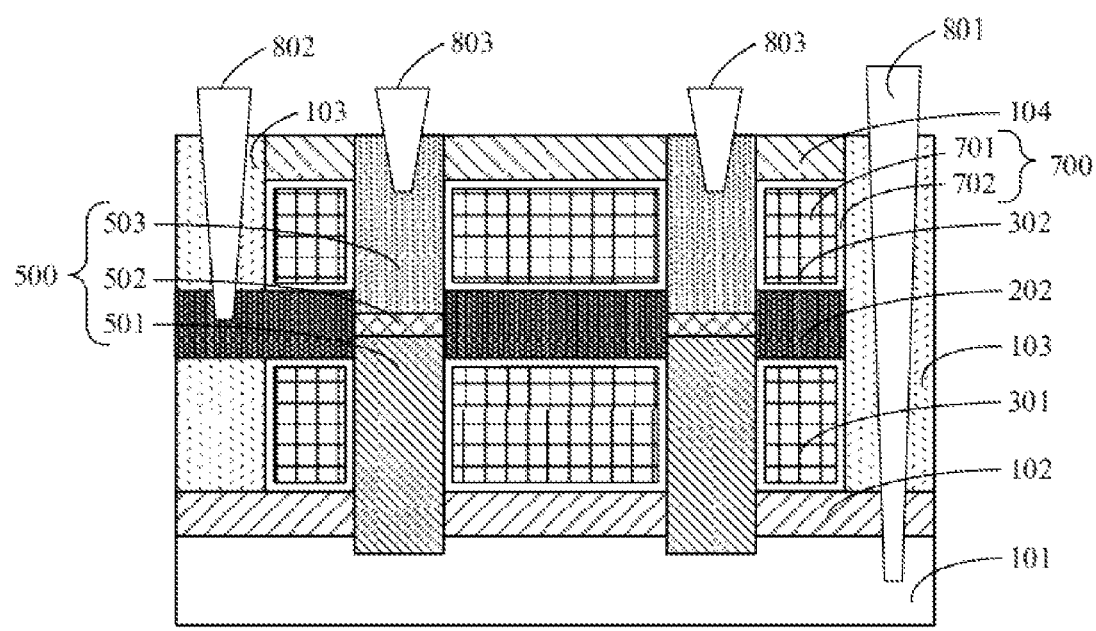
FIG. 4 is another schematic cross-sectional view of a semiconductor structure in an AA1 direction according to an embodiment of the disclosure.
Figure 5:
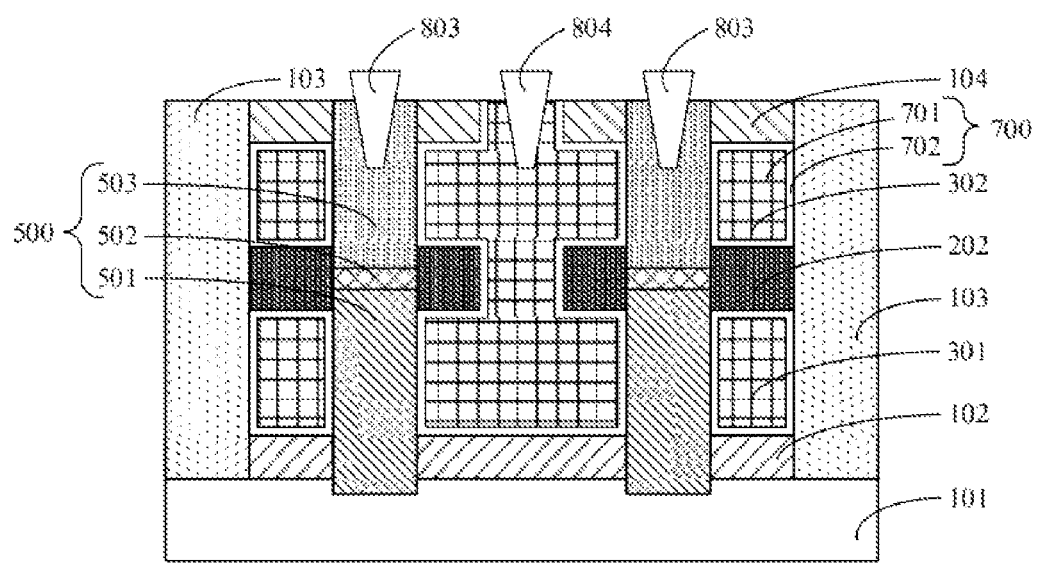
FIG. 5 is another schematic cross-sectional view of a semiconductor structure in a BB1 direction according to an embodiment of the disclosure.

FIG. 1 is a structural schematic diagram of a cross-sectional view of a semiconductor structure according to an embodiment of the disclosure, FIG. 2 is a structural schematic diagram of a cross-sectional view of a semiconductor structure in an AA1 direction according to an embodiment of the disclosure, FIG. 3 is a structural schematic diagram of a cross-sectional view of a semiconductor structure in a BB1 direction according to an embodiment of the disclosure, FIG. 4 is another structural schematic diagram of a cross-sectional view of a semiconductor structure in an AA1 direction according to an embodiment of the disclosure, and FIG. 5 is another structural schematic diagram of a cross-sectional view of a semiconductor structure in a BB1 direction according to an embodiment of the disclosure. The semiconductor structure provided by the embodiment will be described in further detail below with reference to the accompanying drawings.

Referring to FIGS. 1-5, a semiconductor structure includes a base (not marked) and conductive channel structures 500 located on the base (not marked). A conductive channel structure 500 includes a first conductive channel layer 501, a conductive buffer layer 502 and a second conductive channel layer 503 which are sequentially arranged in a stacked manner.

It should be noted that there may be one or more conductive channel structures 500 on the base, and multiple conductive channel structures 500 are separately arranged on the base (not marked); referring to FIG. 1, the embodiment is specifically described with four conductive channel structures 500 on the base as an example, which does not constitute a limitation of the embodiment, and in other embodiments, the number of conductive channel structures 500 may be one, three, five, etc.; and in specific applications, the number of conductive channel structures 500 may be specifically set as desired. In addition, in the embodiment, the four conductive channel structures 500 are distributed in a tetragonal arrangement.

Specifically, one of the first conductive channel layer 501 and the second conductive channel layer 503 is an N-type conductive channel, and the other is a P-type conductive channel. In the embodiment, it is described in detail with the first conductive channel layer 501 being an N-type conductive channel and the second conductive channel layer 503 being a P-type conductive channel as an example, and the embodiment is not limited; and in other embodiments, it is described in detail with the first conductive channel layer 501 being a P-type conductive channel and the second conductive channel layer 503 being an N-type conductive channel.

The first conductive channel layer 501 includes a first conductive channel (not marked), and a first doped region (not marked) and a second doped region (not marked) respectively at two ends of the first conductive channel (not marked), and the first doped region (not marked) is close to the second conductive channel layer 503.

Specifically, the first conductive channel layer 501 is formed by in-situ doping, or by doping after deposition, and the material of the first conductive channel layer 501 is an N-type semiconductor material formed by doping a group VA element into monocrystalline silicon. The doping concentration at both ends of the first conductive channel layer 501 is greater than the doping concentration in the middle, thereby forming the first doped region (not marked) and the second doped region (not marked). In the embodiment, it is described in detail with the second doped region (not marked) close to the base (not marked) and the first doped region (not marked) close to the second conductive channel layer 503 as an example, which does not limit the embodiment. In other embodiments, the first doped region may be close to the base and the second doped region may be close to the second conductive channel layer 503.

The second conductive channel layer 503 includes a second conductive channel (not marked), and a third doped region (not marked) and a fourth doped region (not marked) respectively at two ends of the second conductive channel (not marked), and the third doped region (not marked) is close to the first conductive channel layer 501.

Specifically, the second conductive channel layer 503 is formed by in-situ doping, or by doping after deposition, and the material of the second conductive channel layer 503 is a P-type semiconductor material formed by doping a group IIIA element into monocrystalline silicon. The doping concentration at both ends of the second conductive channel layer 503 is greater than the doping concentration in the middle, thereby forming the third doped region (not marked) and the fourth doped region (not marked). In the embodiment, it is described in detail with the fourth doped region (not marked) away from the base (not marked) and the third doped region (not marked) close to the first conductive channel layer 501 as an example, which does not limit. In other embodiments, the third doped region may be away from the base and the fourth doped region may be close to the first conductive channel layer 501.

The conductive buffer layer 502 is located between the first conductive channel layer 501 and the second conductive channel layer 503 for reducing electrical interference between the first doped region (not marked) and the third doped region (not marked). In an example, the material of the conductive buffer layer 502 is polycrystalline silicon, and the conductive buffer layer 502 prevents the problem of electrical interference between the first doped region (not marked) and the third doped region (not marked) by reducing the dielectric constant between the first doped region (not marked) and the third doped region (not marked).

With continued reference to FIGS. 1-5, the first conductive layer is located on the base (not marked) and is in contact with the second doped region (not marked). In the embodiment, the material of the first conductive layer is a semiconductor conductive material or a metal conductive material such as tungsten.

In the embodiment, the first conductive layer 201 is simultaneously in contact with the second doped regions (not marked) in the four conductive channel structures 500 for deriving electrical signals from the second doped regions (not marked) in the four conductive channel structures 500.

Specifically, the embodiment provides two implementation modes of the first conductive layer, details are provided as follows.

In an example, referring to FIGS. 2 and 3, the base (not marked) includes a substrate 101 and an isolation layer 102, the isolation layer 102 is located on a top surface of the substrate 101, and the first conductive layer 201 is located on the top surface of the isolation layer 102.

In another example, referring to FIGS. 4 and 5, the base (not marked) includes a substrate 101 and an isolation layer 102, the first conductive layer (not marked) is located in the substrate 101, the isolation layer 102 is located on the top surface of the substrate 101, and the first conductive channel layers 501 penetrate through the isolation layer 102 and part of the substrate 101, such that the second doped regions (not marked) and the first conductive layer (not marked) are in contact with each other.

In the above two examples, the material of the substrate 101 includes silicon, silicon carbide, gallium arsenide, or the like. In the embodiment, the substrate 101 is formed of the silicon material. The silicon material is adopted as the substrate 101, which is for the understanding of the subsequent formation method by those skilled in the art, not for limiting. In a practical application process, an appropriate material of the substrate 101 may be selected according to requirements. In addition, the material of the isolation layer 102 is silicon nitride.

With continued reference to FIGS. 1-5, the second conductive layer 202 is nested on the conductive channel structures 500 and is in contact with the first doped regions (not marked) and the third doped regions (not marked). In the embodiment, the material of the second conductive layer is a semiconductor conductive material or a metal conductive material such as tungsten.

Specifically, the second conductive layer 202 is parallel to the surface of the first conductive layer 201, and is nested on all the discrete conductive channel structures 500, in a direction perpendicular to the surface of the base (not marked), the second conductive layer 202 has a first commutating hole (refer to FIG. 3 or FIG. 5) penetrating through the second conductive layer 202.

In the embodiment, the positions of the contact surfaces of the first doped regions (not marked) in contact with the conductive buffer layers 502 are lower than the center position of thickness of the second conductive layer 202, and higher than the position of the bottom surface of the second conductive layer 202. The positions of the contact surfaces of the third doped regions (not marked) in contact with the conductive buffer layer 502 is higher than the center position of thickness of the second conductive layer 202, and lower than the position of the top surface of the second conductive layer 202. By limiting the thickness of the second conductive layer 202, a large contact area exists between the second conductive layer 202 and the first doped regions (not marked) and the third doped regions (not marked), thereby ensuring the stability of the electrical connection between the second conductive layer 202 and the first doped regions (not marked) and the third doped regions (not marked).

Furthermore, the thickness of the conductive buffer layers 502 is smaller than ⅓ of the thickness of the second conductive layer 202. By limiting the thickness of the conductive buffer layers 502, a large contact area exists between the second conductive layer 202 and the first doped regions (not marked) and the third doped regions (not marked), thereby ensuring the stability of the electrical connection between the second conductive layer 202 and the first doped regions (not marked) and the third doped regions (not marked).

With continued reference to FIG. 1-5, a gate structure 700 is arranged around the first conductive channels (not marked) and the second conductive channels (not marked).

Specifically, the gate structure 700 includes gate oxide layer 702 and metal gate layer 701. The gate oxide layer 702 covers the exposed surfaces of the first conductive channels, the second conductive channels, the first conductive layer 201 (refer to FIGS. 2 and 3) or the isolation layer 102 (refer to FIGS. 4 and 5), and the second conductive layer 202. The metal gate layer 701 is configured to fill gaps between the gate oxide layer 702, thereby forming the gate structure 700.

In an example, to prevent electrical crosstalk problem between the first conductive layer 201 and the second conductive layer 202 and the gate structure 700, the semiconductor structure further includes a first insulation layer (not shown) between the first conductive layer 201 and the gate structure 700 and a second insulation layer (not shown) between the second conductive layer 202 and the gate structure 700.

In another example, to protect the top surface of the gate structure 700, the semiconductor structure further includes a protective layer 104 nested on top portions of all the discrete conductive channel structures 500 and in contact with the fourth doped regions (not marked). The protective layer 104 has a second communicating hole (refer to FIGS. 3 and 5) therethrough in a direction perpendicular to the surface of the base (not marked). The projections of the first communicating hole and the second communicating hole on the base coincide. The gate structure 700 also fills the second through hole.

Specifically, the top surface of the protective layer 104 is flush with the top surfaces of the second conductive channel layers 503, which facilitates subsequent electrical signal extraction and packaging of the semiconductor structure.

With continued reference to FIGS. 1-5, the base (not marked) of the semiconductor structure includes a structural region and a connecting line region arranged on the periphery of the structural region. A peripheral insulation structure 103 is arranged on the base (not marked) of the connecting line region, and the first conductive layer 201 and the second conductive layer 202 also extend into one side of the peripheral insulation structure 103 of the connecting line region for subsequent electrical connection of the first conductive layer 201 and the second conductive layer 202 through the connecting line region.

Specifically, in the embodiment, a first conductive plug 801 is electrically connected with the first conductive layers 201, a second conductive plug 802 is electrically connected with the second conductive layer 202, third conductive plugs 803 are connected with the fourth doped regions (not marked), and a fourth conductive plug 804 is electrically connected with the gate structure 700. The details are as follows.

In the case that the first conductive layer 201 and the substrate 101 are separately arranged, referring to FIGS. 2 and 3, the first conductive plug 801 penetrates through the peripheral insulation structure 103 and is electrically connected to the first conductive layer 201. Furthermore, the first conductive plug 801 also penetrates through part of the first conductive layer 201 for increasing the contact area between the first conductive plug 801 and the first conductive layer 201, thereby reducing the contact resistance between the first conductive plug 801 and the first conductive layer 201.

In the case that the first conductive layer 201 is arranged in the substrate 101, with reference to FIGS. 4 and 5, the first conductive plug 801 penetrates through the peripheral insulation structure 103 and the insulation layer 102 and is electrically connected to the first conductive layer 201 in the substrate 101. Furthermore, the first conductive plug 801 also penetrates through part of the substrate 101 and the first conductive layer 201 for increasing the contact area between the first conductive plug 801 and the first conductive layer 201, thereby reducing the contact resistance between the first conductive plug 801 and the first conductive layer 201.

The second conductive plug 802 penetrates through part of the peripheral insulation structure 103 and is in contact with the second conductive layer 202. Furthermore, the second conductive plug 802 also penetrates through part of the second conductive layer 202 for increasing the contact area between the second conductive plug 802 and the second conductive layer 202, thereby reducing the contact resistance between the second conductive plug 802 and the second conductive layer 202.

The third conductive plugs 803 are in contact with the fourth doped regions (not marked). Furthermore, the third conductive plugs 803 also penetrate through part of the fourth doped regions (not marked)) for increasing the contact area between the third conductive plugs 803 and the fourth doped regions (not marked), thereby reducing the contact resistance between the third conductive plugs 803 and the fourth doped regions (not marked).

The fourth conductive plug 804 is in contact with the top of the gate structure 700. Furthermore, the fourth conductive plug 804 also penetrates through part of the gate structure 700 for increasing the contact area between the fourth conductive plug 804 and the gate structure 700, thereby reducing the contact resistance between the fourth conductive plug 804 and the gate structure 700.

Optionally, the first conductive layer 201 extends into the peripheral insulation structure 103 on a first side of the connecting line region, the second conductive layer 202 extends into the peripheral insulation structure 103 on a second side of the connecting line region, and the first side and the second side of the connecting line region are located at different sides of the structural region. The extension directions of the first conductive layer 201 and the second conductive layer 202 are different, so that electric signals of the first conductive layer 201 and the second conductive layer 202 are guided out from the connecting line region on different sides of the structural region, and the horizontal area of the semiconductor structure is further reduced.

Compared with the relevant art, the first conductive channel layer and the second conductive channel layer are vertically arranged, namely, the two conductive channels are vertically arranged. As the conductive channels are vertically arranged, the gate structure surrounds the first conductive channels and the second conductive channels in the horizontal direction, thereby avoiding the conductive channels from occupying a large area in the horizontal direction.

Another embodiment of the disclosure relates to a method for forming the semiconductor structure. The method includes that a base including a structural region and a connecting line region is provided, and the base includes a substrate, a first conductive layer and an isolation layer; a first sacrificial layer is formed on the base of the structural region, and a peripheral insulation structure is formed on the base of the connecting line region; a second conductive layer is formed on the first sacrificial layer, and the second conductive layer extends into the peripheral insulation structure of the connecting line region; a second sacrificial layer and a protective layer are sequentially formed on the base of the structural region; the protective layer, the second sacrificial layer, the second conductive layer and the first sacrificial layer are patterned to form openings, and the openings are filled to form conductive channel structures; part of the protective layer is patterned until the second sacrificial layer is exposed, and the second sacrificial layer is removed; part of the second conductive layer is patterned until the first sacrificial layer is exposed, and the first sacrificial layer is removed; and a gate structure filling gaps is formed.

Figure 6:
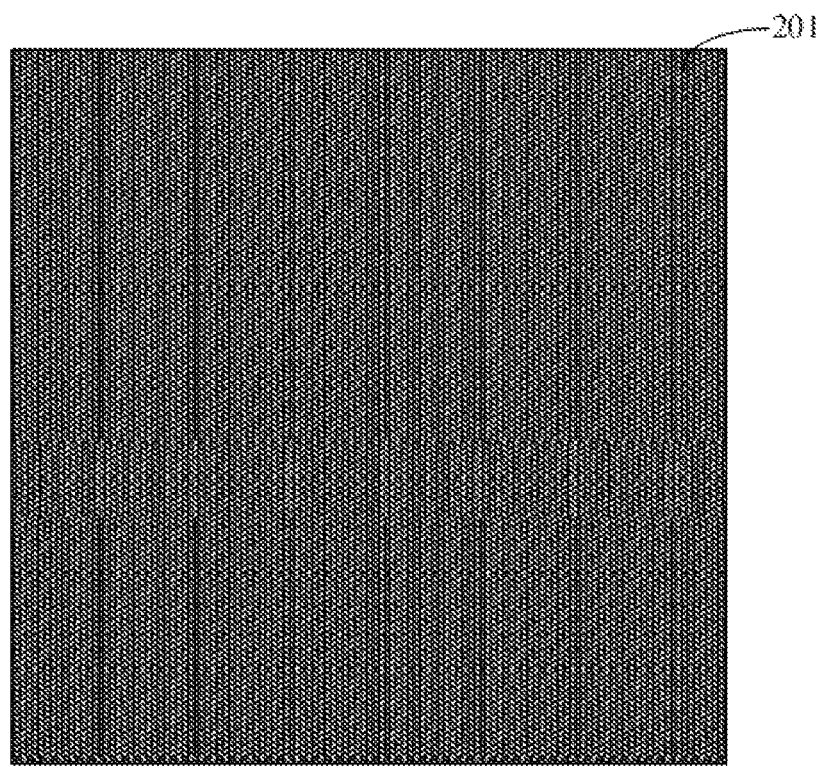
FIG. 6, FIG. 9, FIG. 11, FIG. 13, FIG. 15, FIG. 17, FIG. 19, and FIG. 22 are structural diagrams of a top view corresponding to each step in a method for forming a semiconductor structure according to another embodiment of the disclosure.
Figure 7:
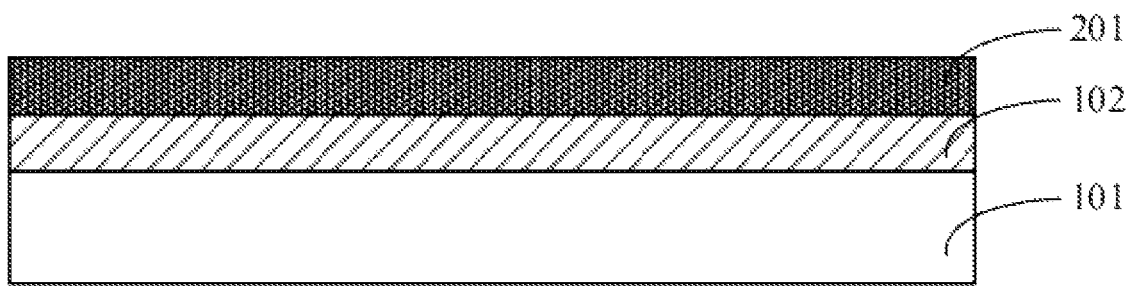
FIG. 7, FIG. 10, FIG. 12, FIG. 14, FIG. 16, FIG. 18, FIG. 20, and FIG. 23 are structural schematic diagrams of a cross-sectional view corresponding to each step in a method for forming a semiconductor structure according to another embodiment of the disclosure.
Figure 8:
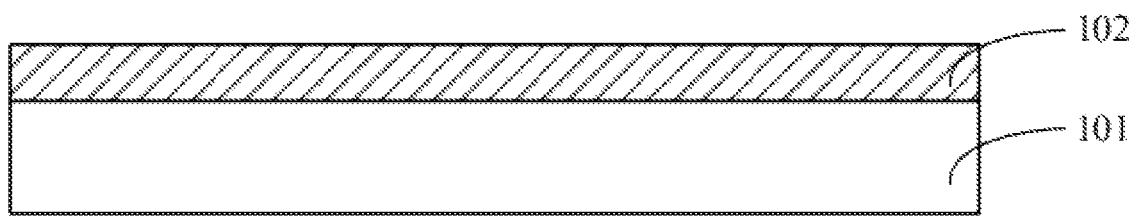
FIG. 8, FIG. 21, and FIG. 24 are structural schematic diagrams of a cross-sectional view where a first conductive layer is formed in a substrate of a method for forming a semiconductor structure according to another embodiment of the disclosure when.
Figure 19:
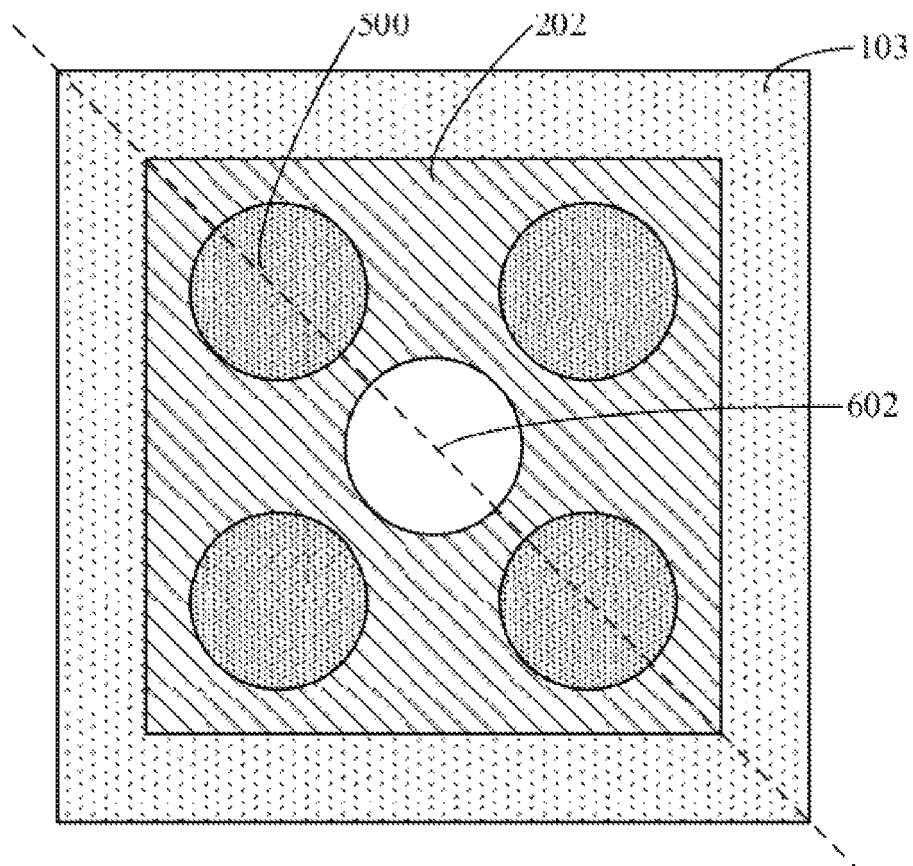
Figure 20:
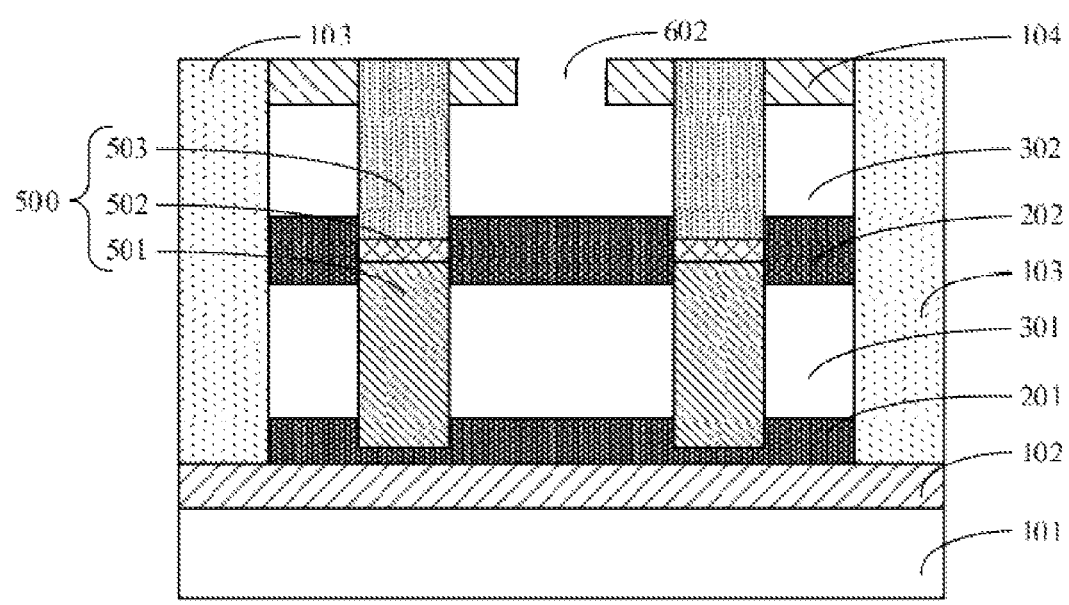
Figure 21:
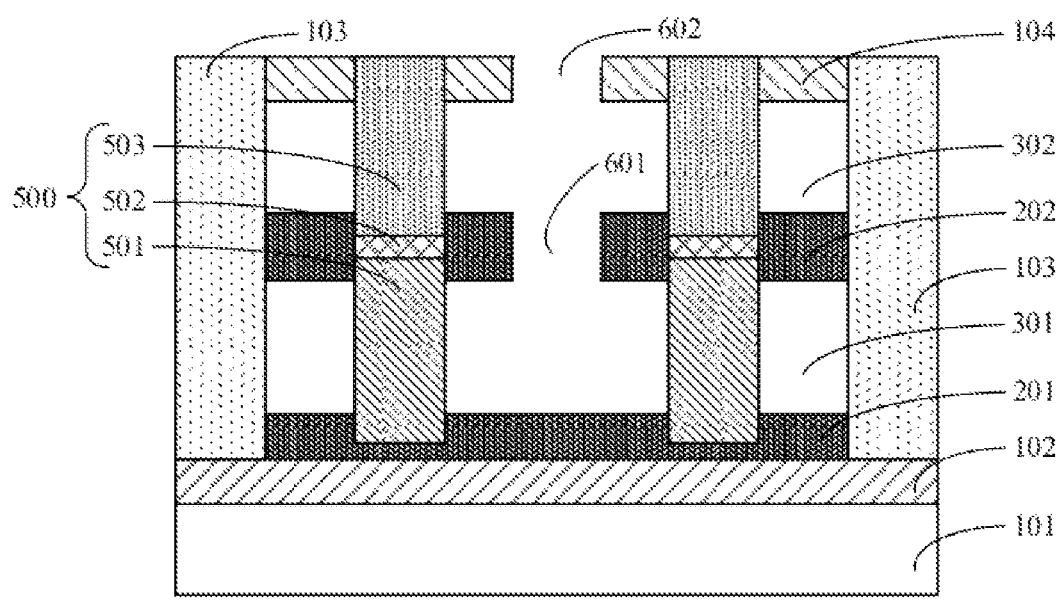
Figure 22:
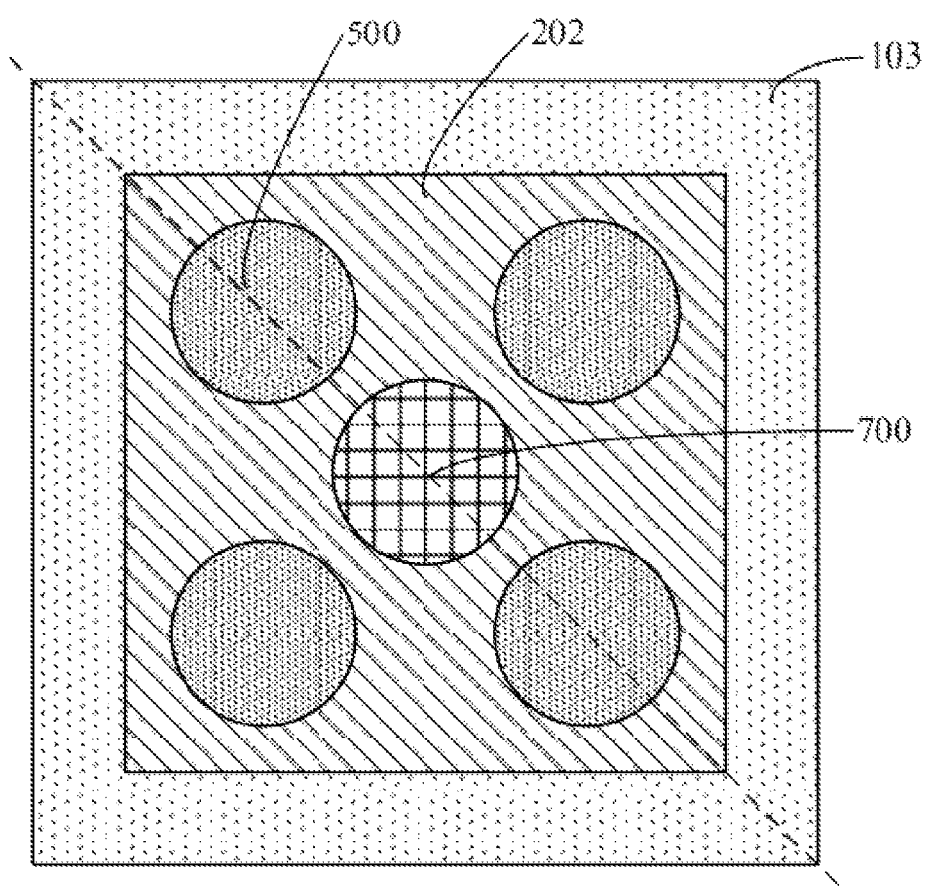
Figure 23:
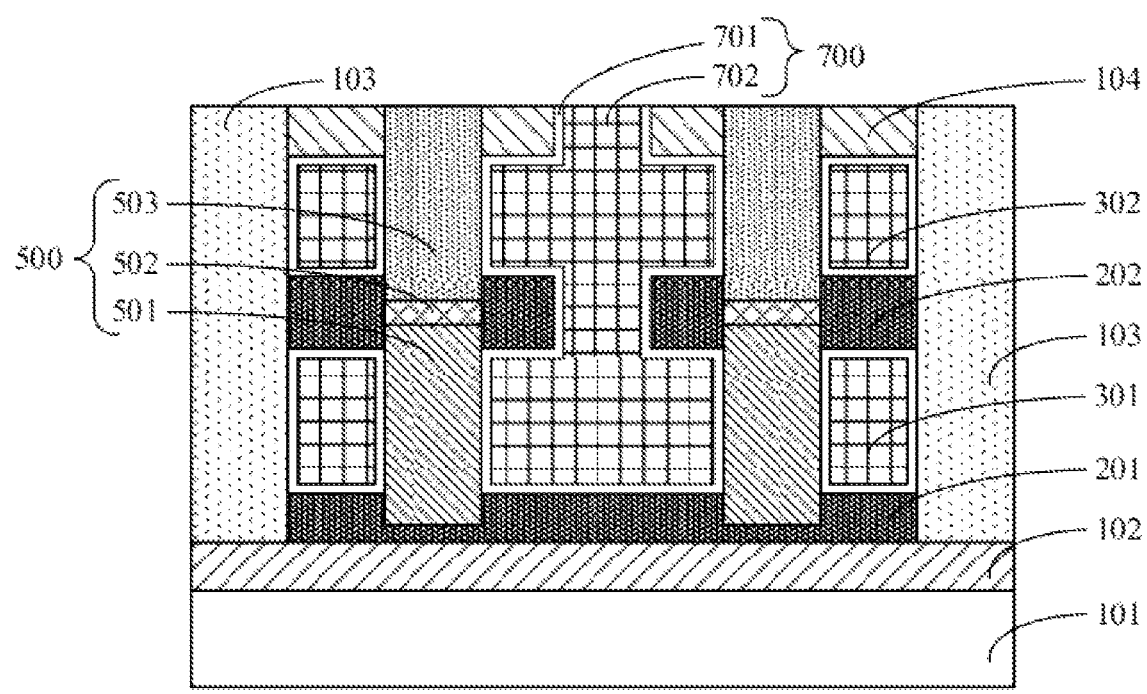
Figure 24:
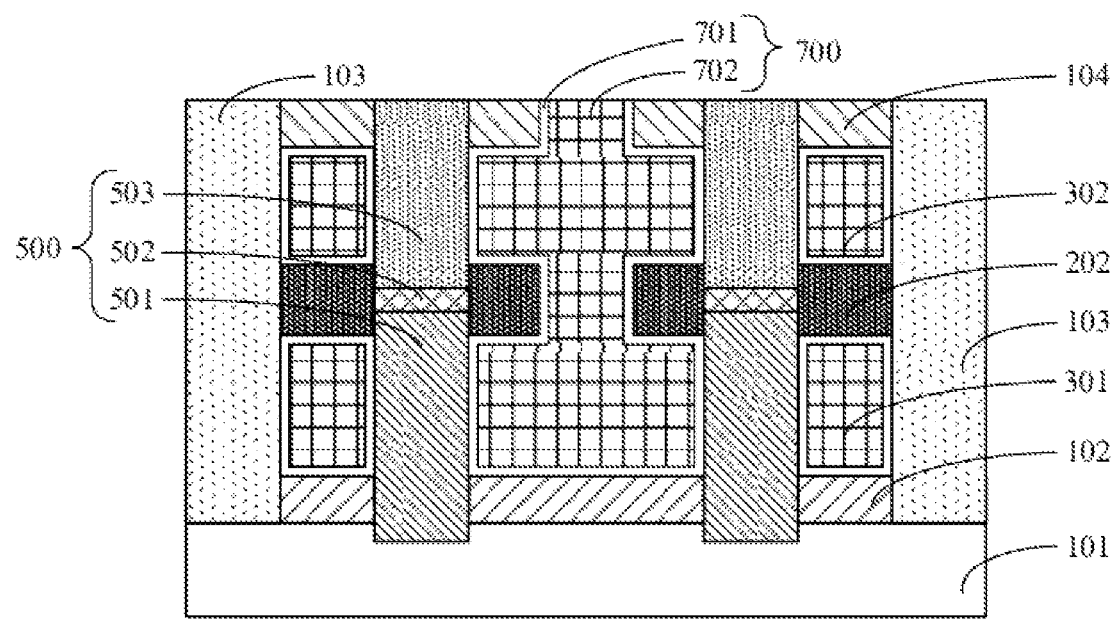

FIG. 6, FIG. 9, FIG. 11, FIG. 13, FIG. 15, FIG. 17, FIG. 19, and FIG. 22 are structural diagrams of a top view corresponding to steps in a method for forming a semiconductor structure according to an embodiment of the disclosure, FIG. 7, FIG. 10, FIG. 12, FIG. 14, FIG. 16, FIG. 18, FIG. 20, and FIG. 23 are schematic cross-sectional structural diagrams corresponding to steps in a method for forming a semiconductor structure according to an embodiment of the disclosure, FIG. 8, FIG. 21, and FIG. 24 are schematic cross-sectional structural diagrams corresponding to a method for forming a semiconductor structure according to an embodiment of the disclosure when a first conductive layer is formed in a base. The method for forming the semiconductor structure according to the embodiments will be described in detail below with reference to the accompanying drawings, and the same or corresponding parts of the above embodiment will not be described in detail below.

Referring to FIGS. 6-8, the base (not marked) including a structural region and a connecting line region is provided, and the base (not marked) includes a substrate 101, a first conductive layer 201, and an isolation layer 102.

In an example, referring to FIG. 7, the operation that the base (not marked) including a structural region and a connecting line region is provided includes: a substrate 101 including a structural region and a connecting line region is provided, the isolation layer 102 is formed on the substrate 101 of the structural region, and the first conductive layer 201 is formed on the isolation layer 102.

In another example, referring to FIG. 8, the operation that the base (not marked) including a structural region and a connecting line region is provided, includes: a substrate 101 including a structural region and a connecting line region is provided, the first conductive layer (not marked) is formed on the substrate 101 of the structural region in a doping manner, and the isolation layer 102 is formed on the substrate 101 of the structural region.

In the embodiment, the material of the substrate 101 includes silicon, silicon carbide or gallium arsenide, etc. In the embodiment, the substrate 101 is formed of a silicon material, and the silicon material is adopted as the substrate 101 for the understanding of the subsequent formation method by those skilled in the art, not for limiting. In a practical application process, an appropriate material of the substrate 101 may be selected according to requirements. In addition, the material of the isolation layer 102 is silicon nitride. The first conductive layer 201 is formed of a semiconductor conductive material or a metallic conductive material, such as doped silicon or tungsten.

Figure 9:
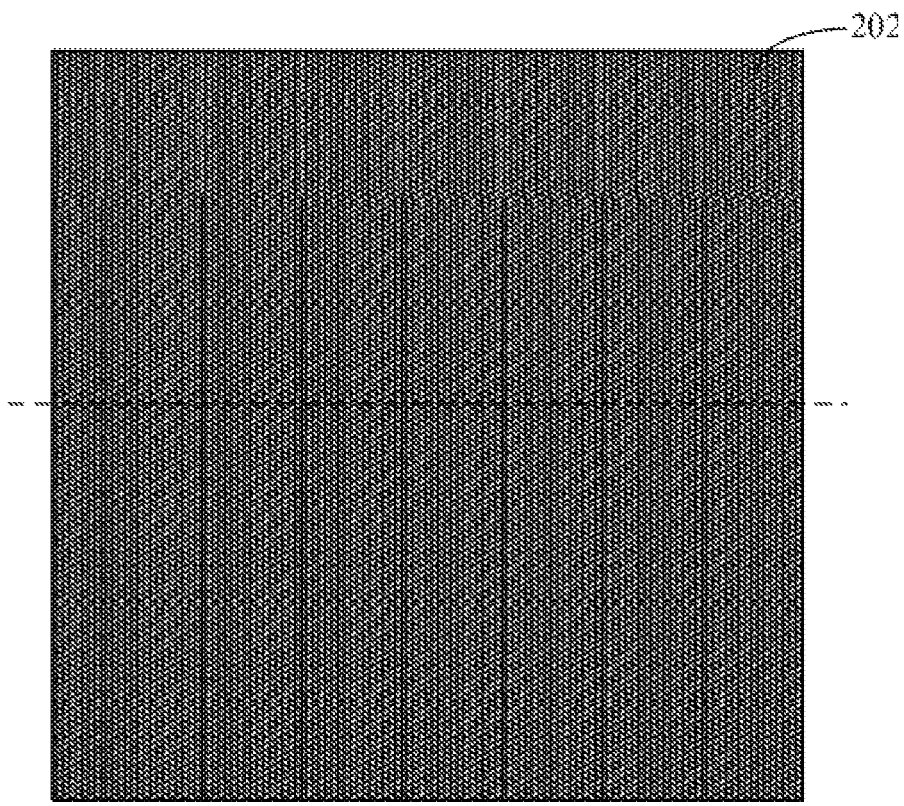
Figure 10:
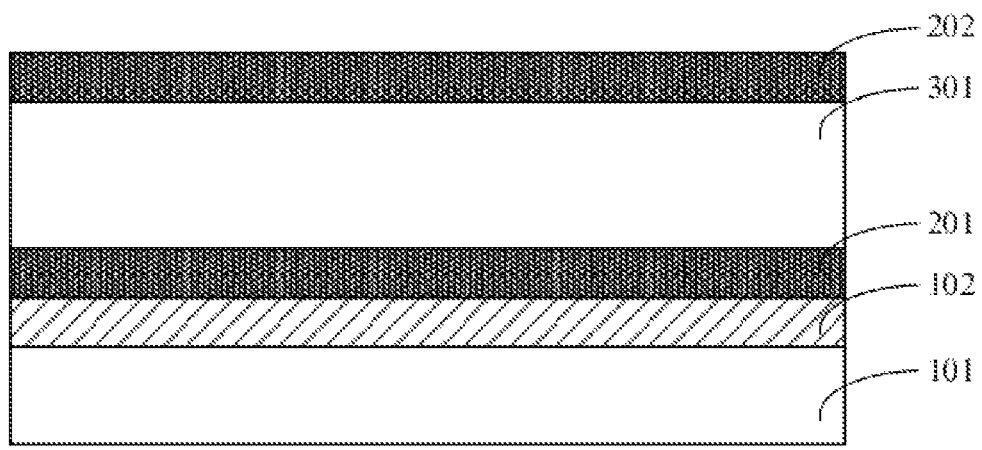

Referring to FIGS. 9 and 10, the first sacrificial layer 301 is formed on the base (not marked) of the structural region, the peripheral insulation structure 103 (refer to FIG. 11) is formed on the base (not marked) of the connecting line region, and the second conductive layer 202 is formed on the first sacrificial layer 301.

In the embodiment, the first sacrificial layer 301 is formed by spin coating, the deposition rate is high with the spin coating, and the thick first sacrificial layer 301 may be deposited in a short time. In addition, the first sacrificial layer 301 is formed of a carbon-containing or oxygen-containing semiconductor material, which may be subsequently removed by ashing or dry etching without affecting other structures. In addition, the second conductive layer 202 is formed of a semiconductor conductive material or a metal conductive material, such as doped silicon or tungsten, or the like.

Figure 11:
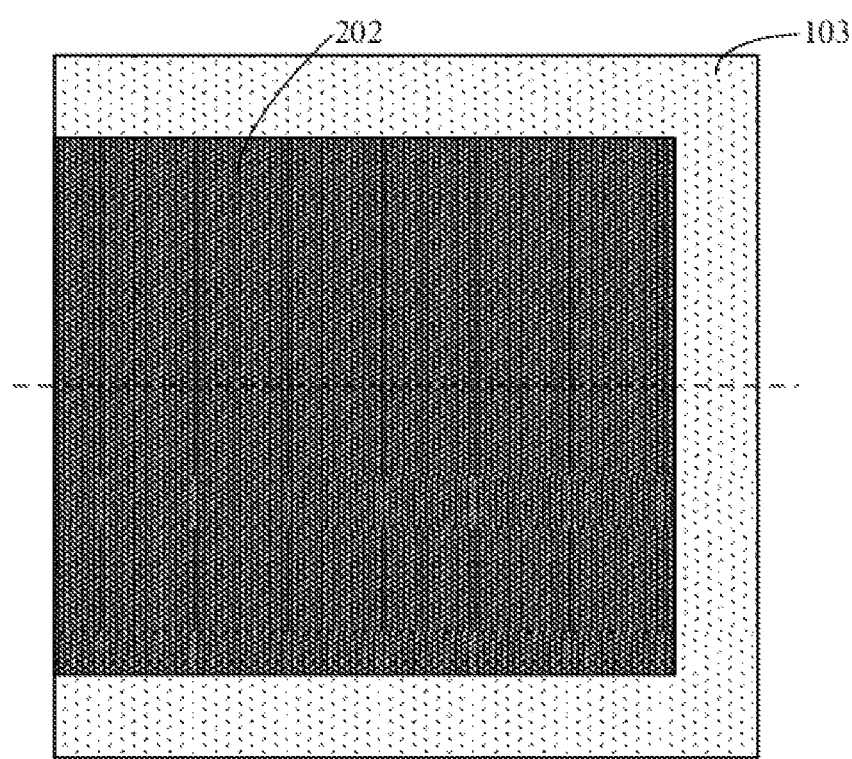
Figure 12:
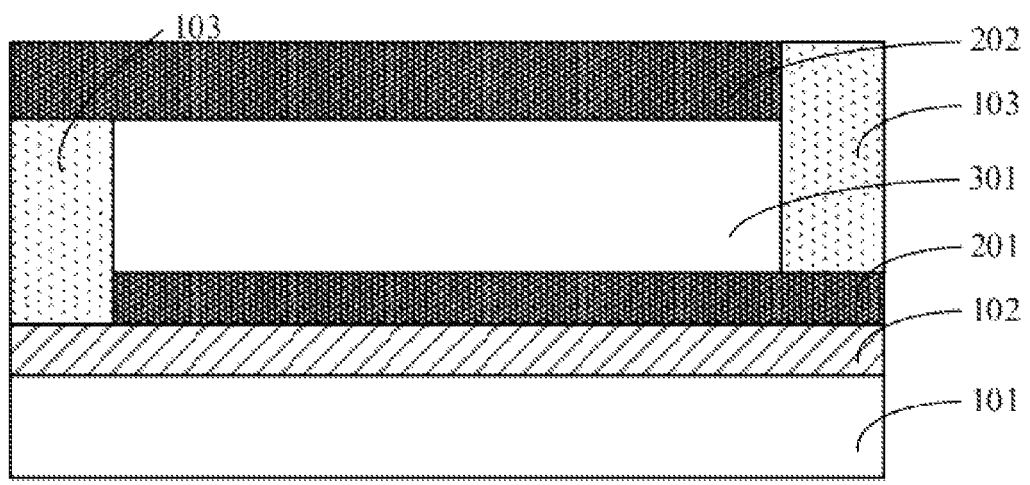

In combination with FIGS. 11 and 12, the formed second conductive layer 202 extends into the peripheral insulation structure 103 of the connecting line region. Specifically, the formed first conductive layer 201 also extends into the peripheral insulation structure 103 of the connecting line region.

Optionally, the first conductive layer 201 extends into the peripheral insulation structure 103 on a first side of the connecting line region, the second conductive layer 202 extends into the peripheral insulation structure 103 on a second side of the connecting line region, and the first side and the second side of the connecting line region are located on different sides of the structural region. The extension directions of the first conductive layer 201 and the second conductive layer 202 are different, so that electric signals of the first conductive layer 201 and the second conductive layer 202 are guided out from the connecting line region on different sides of the structural region, and the horizontal area of the semiconductor structure is further reduced.

Figure 13:
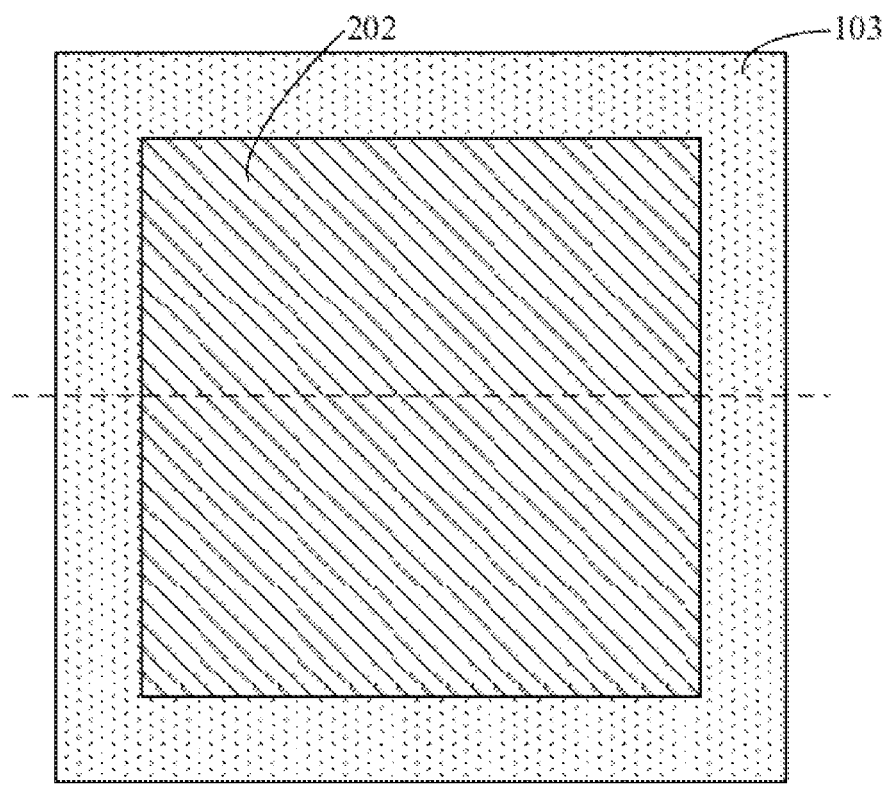
Figure 14:
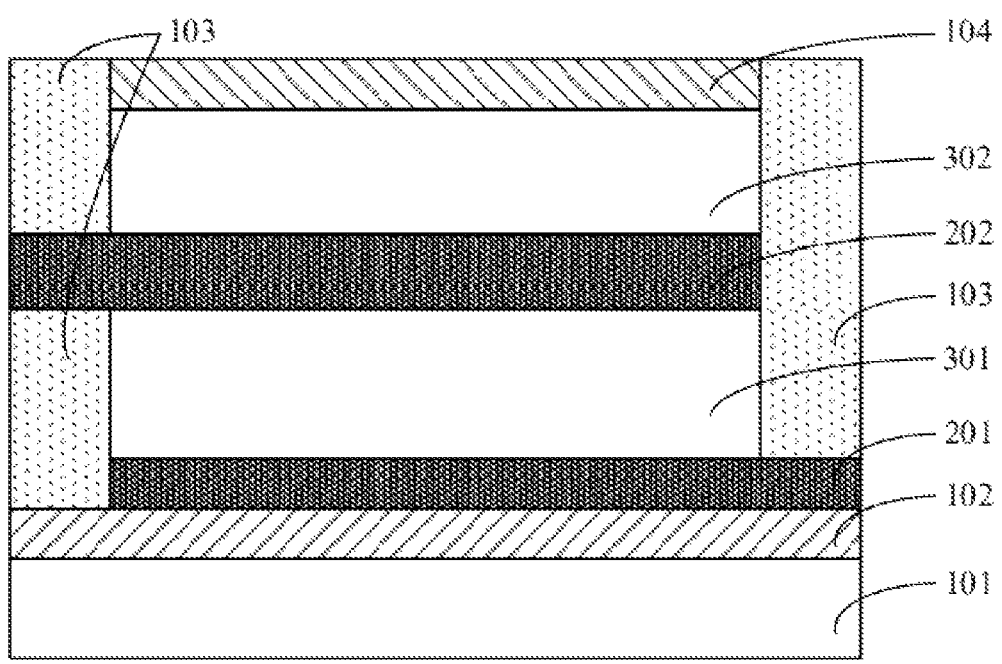

Referring to FIGS. 13 and 14, the second sacrificial layer 302 and the protective layer 104 are sequentially formed on the base (not marked) of the structural region.

In the embodiment, the second sacrificial layer 302 is formed by spin coating, the deposition rate is high with the spin coating, and the thick second sacrificial layer 302 may be deposited in a short time. In addition, the second sacrificial layer 302 is formed of a carbon-containing or oxygen-containing semiconductor material, which may be subsequently removed by ashing or dry etching without affecting other structures. In addition, the material of the protective layer 104 is silicon nitride.

Figure 15:
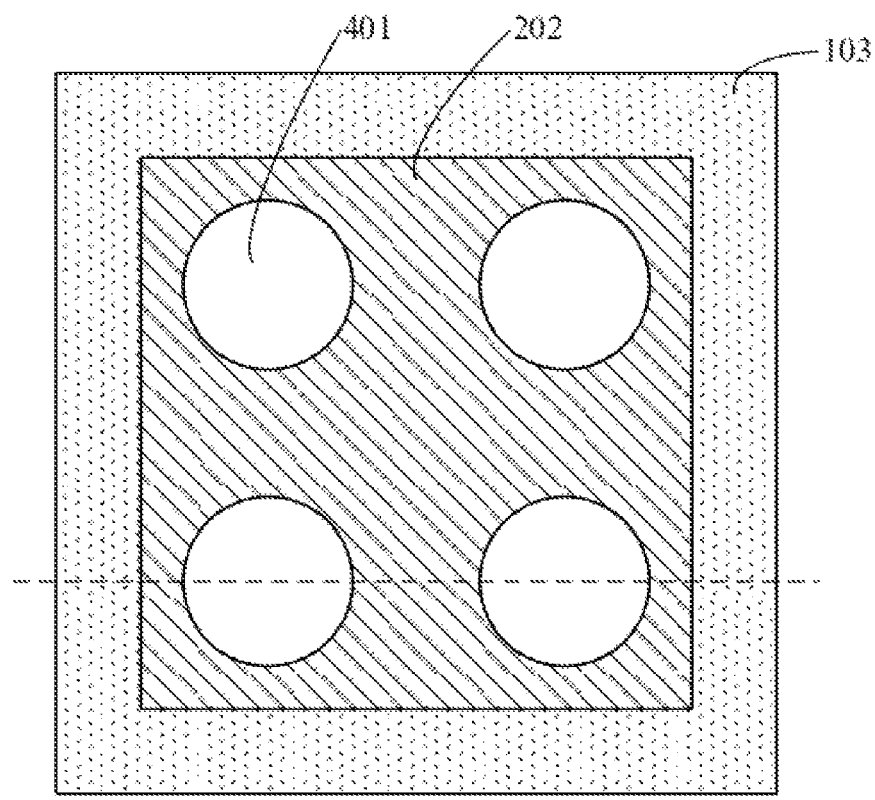
Figure 16:
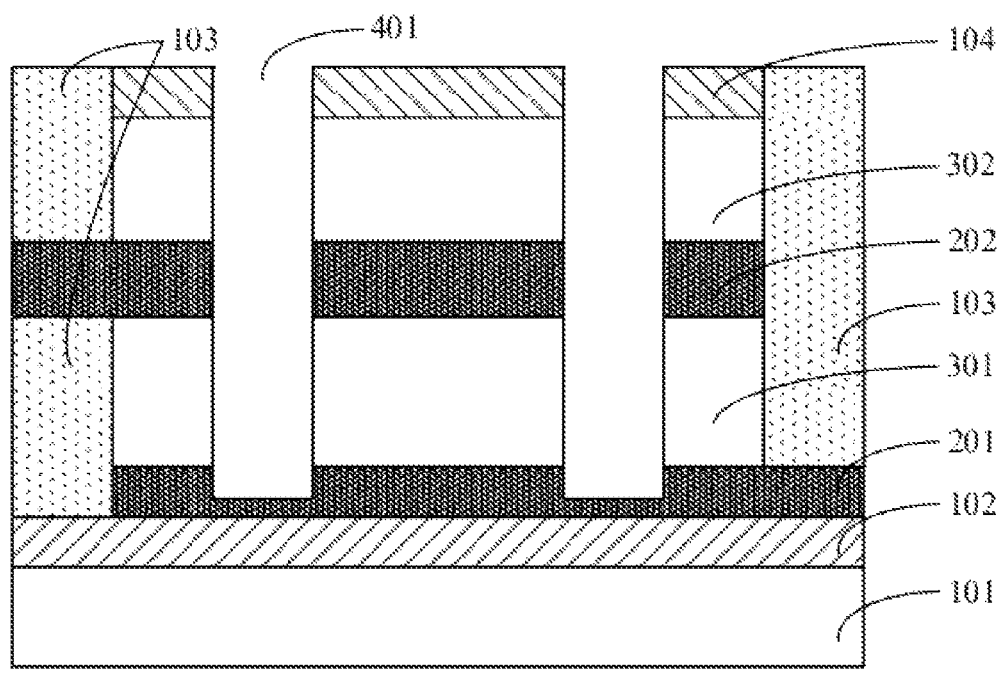

Referring to FIGS. 15 and 16, the protective layer 104, the second sacrificial layer 302, the second conductive layer 202, and the first sacrificial layer 301 are patterned to form openings 401. Furthermore, in the embodiment, part of the first conductive layer 201 is also patterned for increasing the surface area of the first conductive layer 201 exposed by the openings 401.

A process for the patterning includes, but is not limited to: forming a mask layer on the protective layer 104, and then patterning the semiconductor structure based on the formed mask layer. In addition, there may be one or more openings 401 formed by patterning, and multiple openings are discrete arranged on the base (not marked). Referring to FIG. 15, the embodiment is specifically described with four openings 401 formed by patterning as an example and the embodiment is not limited to this. In other embodiments, the openings formed by patterning may be one, three, five, or the like. In a specific application, the number of the patterned openings 401 may be specifically set according to requirements. In addition, in the embodiment, the four openings are distributed in a tetragonal arrangement.

Figure 17:
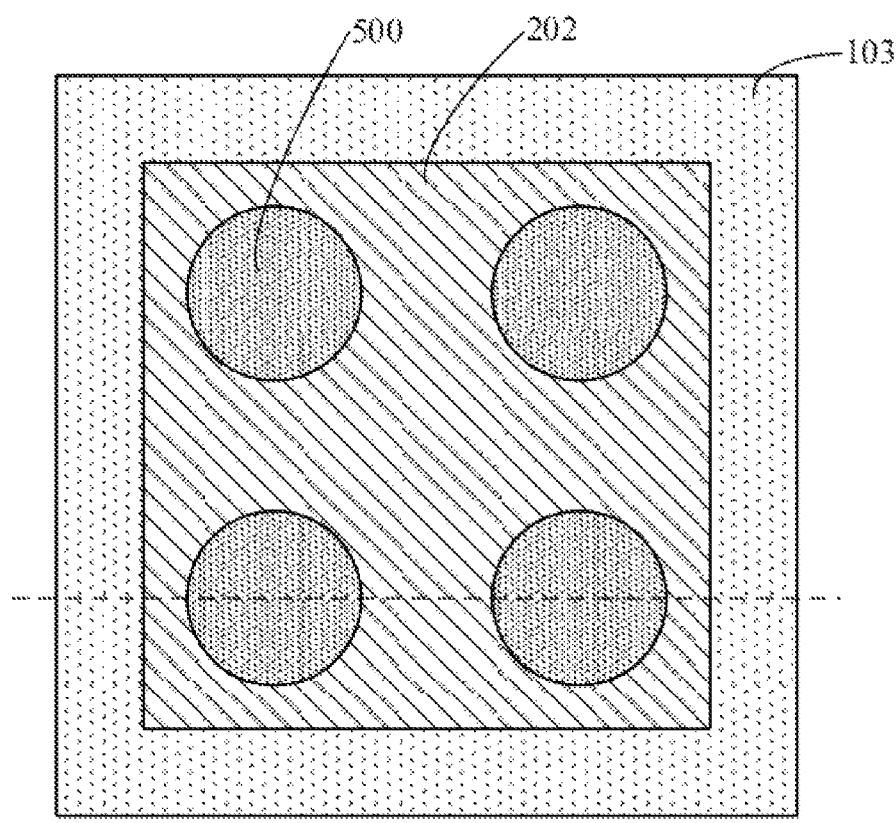
Figure 18:
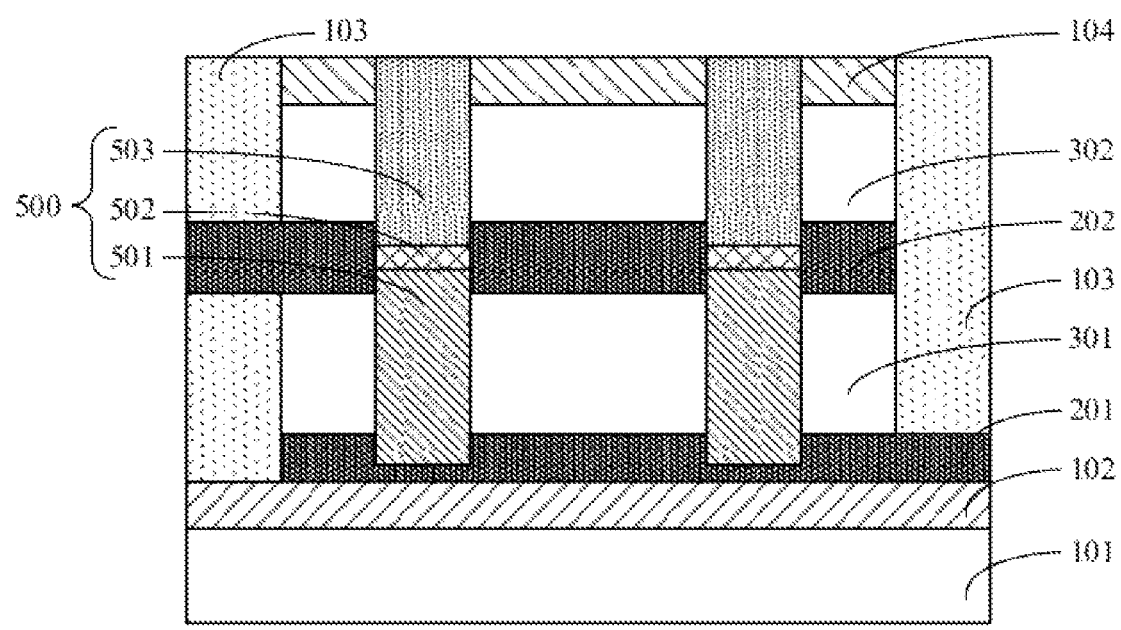

Referring to FIGS. 17 and 18, conductive channel structures 500 filling the openings 401 are formed.

Specifically, each conductive channel structure 500 includes a first conductive channel layer 501, a conductive buffer layer 502 and a second conductive channel layer 503 which are sequentially arranged in a stacked manner.

Each of the first conductive channel layers 501 includes a first conductive channel (not marked), and a first doped region (not marked) and a second doped region (not marked) respectively at two ends of the first conductive channel (not marked), and the first doped region (not marked) is close to the second conductive channel layer 503.

Specifically, the first conductive channel layers 501 are formed by in-situ doping or by doping after deposition, and the material of the first conductive channel layers 501 is an N-type semiconductor material formed by doping a group VA element into monocrystalline silicon. The doping concentration at both ends of the first conductive channel layer 501 is greater than the doping concentration in the middle, thereby forming the first doped region (not marked) and the second doped region (not marked). In the embodiment, it is described in detail with the second doped region (not marked) close to the base (not marked) and the first doped region (not marked) close to the second conductive channel layer 503 as an example, and the embodiment is not limited to this. In other embodiments, the first doped region may be close to the base and the second doped region may be close to the second conductive channel layer 503.

Each second conductive channel layer 503 includes a second conductive channel (not marked), and a third doped region (not marked) and a fourth doped region (not marked) respectively at two ends of the second conductive channel (not marked), and the third doped region (not marked) is close to the first conductive channel layer 501.

Specifically, the second conductive channel layers 503 are formed by in-situ doping or by doping after deposition, and the material of the second conductive channel layers 503 is a P-type semiconductor material formed by doping a group MA element into monocrystalline silicon. The doping concentration at both ends of the second conductive channel layer 503 is greater than the doping concentration in the middle, thereby forming the third doped region (not marked) and the fourth doped region (not marked). In the embodiment, it is described in detail with the fourth doped regions (not marked) close to the base (not marked) and the third doped regions (not marked) close to the first conductive channel layers 501 as an example, and the embodiment is not limited to this. In other embodiments, the third doped regions may be away from the base and the fourth doped regions may be close to the first conductive channel layers 501.

It should be noted that, one of the first conductive channel layer 501 and the second conductive channel layer 503 is an N-type conductive channel, and the other is a P-type conductive channel. In the embodiment, it is described in detail with the first conductive channel layer 501 being an N-type conductive channel and the second conductive channel layer 503 being a P-type conductive channel as an example, and the embodiment is not limited; and in other embodiments, it may be described in detail with the first conductive channel layer 501 being a P-type conductive channel and the second conductive channel layer 503 being an N-type conductive channel.

Each conductive buffer layer 502 is located between the first conductive channel layer 501 and the second conductive channel layer 503 for reducing electrical interference between the first doped region (not marked) and the third doped region (not marked). In an example, the material of the conductive buffer layer 502 is polycrystalline silicon, and the conductive buffer layer 502 prevents the problem of electrical interference between the first doped region (not marked) and the third doped region (not marked) by reducing the dielectric constant between the first doped region (not marked) and the third doped region (not marked).

Referring to FIGS. 19-21, part of the protective layer 104 is patterned until the second sacrificial layer 302 is exposed, and a second communicating hole 602 is formed. The second sacrificial layer 302 is removed based on the communicating hole 602. Part of the second conductive layer 202 is patterned until the first sacrificial layer 301 is exposed to form a first communicating hole 601. The first sacrificial layer 301 is removed based on the first communicating hole 601.

A process of patterning includes, but is not limited to: forming a mask layer on the protective layer 104, and then patterning the semiconductor structure based on the formed mask layer.

In the embodiment, the first sacrificial layer 301 and the second sacrificial layer 302 are removed by a wet etching. It is clear to those skilled in the art that with the wet etching, the etching is performed on a certain semiconductor material, and other semiconductor structures are not affected. In addition, in other embodiments, the first sacrificial layer 301 and the second sacrificial layer 302 may be removed by ashing. The removing rate of ashing to the first sacrificial layer 301 and the second sacrificial layer 302 is relatively high, and other semiconductor structures are not affected, either.

Referring to FIGS. 22-24 (referring to FIG. 24 with the base as the first conductive layer), the gate structure 700 filling gaps is formed.

Specifically, the gate structure 700 includes gate oxide layer 702 and metal gate layer 701, the gate oxide layer 702 covers the exposed surfaces of the first conductive channel, the second conductive channel, the first conductive layer 201 (refer to FIGS. 2 and 3) or the isolation layer 102 (refer to FIGS. 4 and 5), and the second conductive layer 202, and the metal gate layer 701 is configured to fill gaps between the gate oxide layer 702, thereby forming the gate structure 700.

In an example, to prevent electrical crosstalk problem between the first conductive layer 201 and the second conductive layer 202 and the gate structure 700, the formed semiconductor structure further includes: a first insulation layer (not shown) between the first conductive layer 201 and the gate structure 700; and a second insulation layer (not shown) between the second conductive layer 202 and the gate structure 700.

Referring to FIGS. 1-5 (referring to FIGS. 4 and 5 with the base as the first conductive layer), a first conductive plug 801 electrically connected with the first conductive layer 201, a second conductive plug 802 electrically connected with the second conductive layer 202, third conductive plugs 803 electrically connected with the fourth doped regions (not marked), and a fourth conductive plug 804 electrically connecting the gate structure 700 are formed, specifically as follows.

In the case that the first conductive layer 201 and the substrate 101 are separately arranged, with reference to FIGS. 2 and 3, the first conductive plug 801 penetrates through the peripheral insulation structure 103 and is electrically connected to the first conductive layer 201. Furthermore, the first conductive plug 801 also penetrates through part of the first conductive layer 201 for increasing the contact area between the first conductive plug 801 and the first conductive layer 201, thereby reducing the contact resistance between the first conductive plug 801 and the first conductive layer 201.

In the case that the first conductive layer 201 is arranged in the substrate 101, with reference to FIGS. 4 and 5, the first conductive plug 801 penetrates through the peripheral insulation structure 103 and the isolation layer 102 and is electrically connected to the first conductive layer 201 in the substrate 101. Furthermore, the first conductive plug 801 also penetrates through part of substrate 101 and the first conductive layer 201 to increase the contact area between the first conductive plug 801 and the first conductive layer 201, thereby reducing the contact resistance between the first conductive plug 801 and the first conductive layer 201.

The second conductive plug 802 penetrates through part of the peripheral insulation structure 103 and is in contact with the second conductive layer 202. Furthermore, the second conductive plug 802 also penetrates through part of the second conductive layer 202 to increase the contact area between the second conductive plug 802 and the second conductive layer 202, thereby reducing the contact resistance between the second conductive plug 802 and the second conductive layer 202.

The third conductive plugs 803 are in contact with the fourth doped regions (not marked). Furthermore, the third conductive plugs 803 also penetrate through part of the fourth doped regions to increase the contact area between the third conductive plugs 803 and the fourth doped regions (not marked), thereby reducing the contact resistance between the third conductive plugs 803 and the fourth doped regions (not marked).

The fourth conductive plug 804 is in contact with the top of the gate structure 700. Furthermore, the fourth conductive plug 804 also penetrates through part of the gate structure 700 to increase the contact area between the fourth conductive plug 804 and the gate structure 700, thereby reducing the contact resistance between the fourth conductive plug 804 and the gate structure 700.

Compared with the related art, the first conductive channel layers and the second conductive channel layers are vertically arranged, namely, the two conductive channels are vertically arranged, the conductive channels are vertically arranged, and the gate structure surrounds the first conductive channels and the second conductive channels in the horizontal direction, thereby avoiding the conductive channels occupying a very large area in the horizontal direction.

The above steps are divided only for clear description. They can be combined into one step or certain steps can be split and divided into multiple steps during implementation. As long as the same logical relation is included, any modification is within the protection scope of the application. An addition of an inconsequential modification or introduction of an inconsequential design into the flow of the core design but not changing the flow is also within the protection scope of the application.

Since the above-described embodiment corresponds to this embodiment, this embodiment can be implemented in cooperation with the above-described embodiment. The related technical details mentioned in the above-described embodiment are applicable in this embodiment, and the technical effects that can be achieved in the above-described embodiment can also be achieved in this embodiment, which are not repeated here in order to reduce repetition. Accordingly, the related technical details mentioned in this embodiment may also be applied in the above-described embodiment.

Another embodiment of the disclosure further provides a method for forming a semiconductor structure. The method includes that a base including a structural region and a connecting line region is provided, the base includes a substrate, a first conductive layer and an isolation layer; a first sacrificial layer is formed on the base in the structural region, and a peripheral insulation structure is formed on the base in the connecting line region; the first sacrificial layer is patterned to form first channels penetrating through the first sacrificial layer; a second conductive layer filling the first channel and covering the first sacrificial layer is formed, and the second conductive layer extends into the peripheral insulation structure of the connecting line region; a second sacrificial layer and a protective layer are sequentially formed on the base of the structural region; the second sacrificial layer is patterned to form second channels penetrating through the second sacrificial layer, and projections of the first channels and the second channels on the base coincide; second conductive channel layers filling the second channels are formed; part of the protective layer is patterned until the second sacrificial layer is exposed, and the second sacrificial layer is removed; part of the second conductive layer is patterned until the first sacrificial layer is exposed, and the first sacrificial layer is removed; and a gate structure filling gaps is formed. Compared with the previous embodiment, in the embodiment, the conductive channel structures are formed in different steps, and compared with the conductive channel structures formed at one time, the aspect ratio of the grooves needing to be filled is relatively small, so as to ensure that the formed conductive channel structures have good compactness.

FIGS. 25-30 are schematic cross-sectional structural diagrams corresponding to steps in a method for forming a semiconductor structure according to an embodiment of the disclosure. The method for forming the semiconductor structure according to the embodiment will be described in detail below with reference to the accompanying drawings, and the same or corresponding parts of the above embodiment will not be described in detail below.

Figure 25:
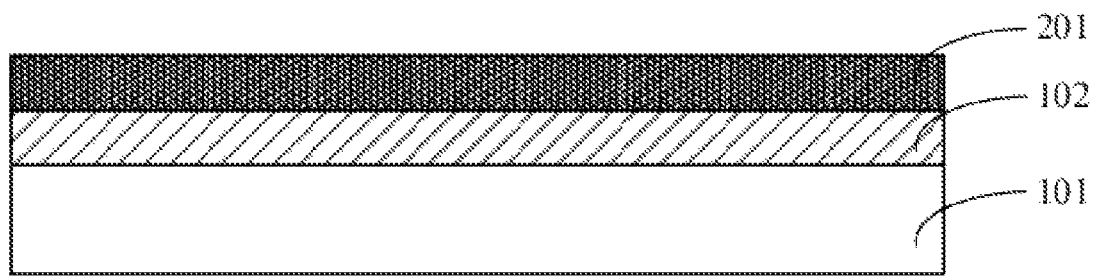
FIG. 25-FIG. 30 are structural schematic diagrams of a cross-sectional view corresponding to each step in a method for forming a semiconductor structure according to another embodiment of the disclosure.

Referring to FIGS. 6 and 25, the base (not marked) including a structural region and a connecting line region is provided, and the base (not marked) includes a substrate 101, a first conductive layer 201, and an isolation layer 102.

Figure 26:
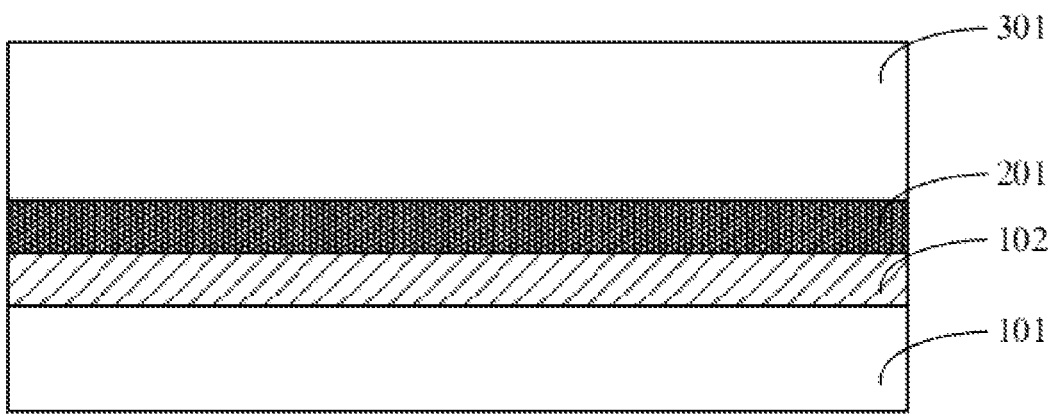

Referring to FIG. 26, a first sacrificial layer 301 is formed on a base (not marked) of the structural region.

Figure 27:
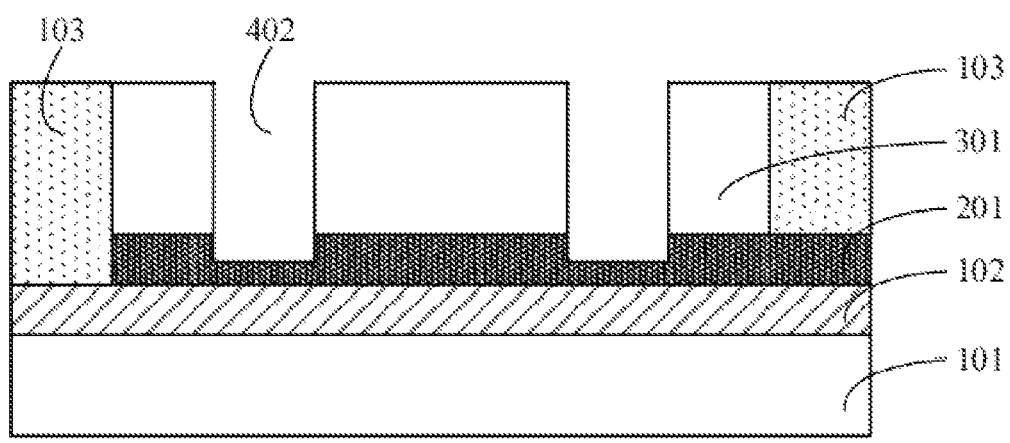

Referring to FIG. 27, a peripheral insulation structure 103 is formed on the base (not marked) of the connecting line region, and the first sacrificial layer 301 is patterned to form first channels 402 penetrating through the first sacrificial layer 301.

A process for patterning includes, but is not limited to: forming a mask layer on the first sacrificial layer 301, and then patterning the semiconductor structure based on the formed mask layer. In addition, there may be one or more first channels 402 formed by patterning, and multiple openings are separately arranged on the base (not marked). Referring to FIG. 27, the embodiment is specifically described with four the first channels 402 formed by patterning as an example, which does not limit the embodiment. In other embodiments, the openings formed by patterning may be one, three, five, or the like. In a specific application, the number of the patterned first channels 402 may be specifically set according to requirements. In addition, in the embodiment, the four openings are distributed in a tetragonal arrangement.

Figure 28:
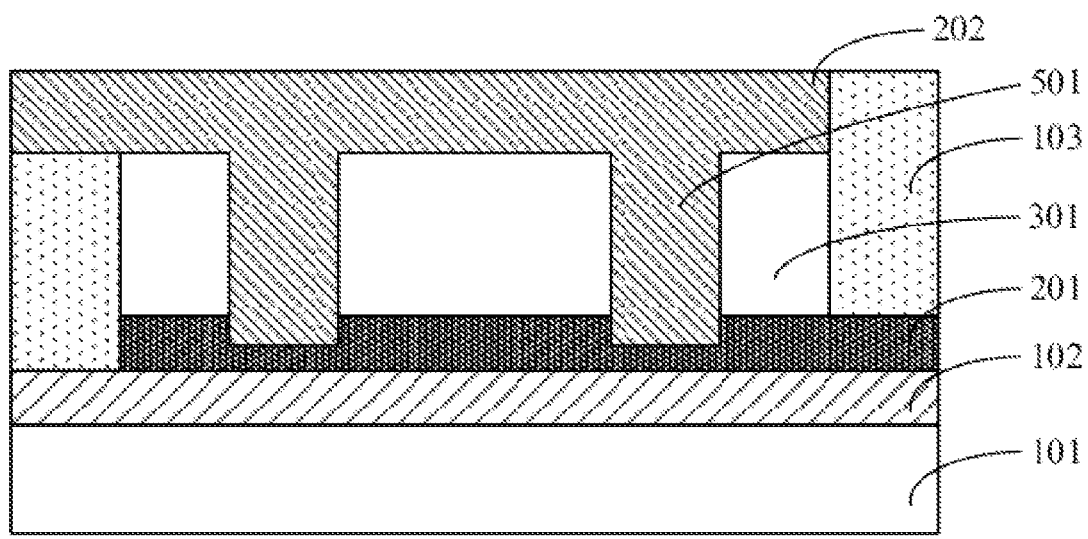

Referring to FIG. 28, a second conductive layer 202 filling the first channel 402 and covering the first sacrificial layer 301 is formed, in which the second conductive layer 202 extends into the peripheral insulation structure 103 of the connecting line region, and the part of the second conductive layer 202 filling the first channel 402 serves as the first conductive channel layers 501.

Each of the first conductive channel layers 501 includes a first conductive channel (not marked), and a first doped region (not marked) and a second doped region (not marked) respectively at two ends of the first conductive channel (not marked), and the first doped region (not marked) is close to the second conductive channel layer 503.

Specifically, the first conductive channel layers 501 are formed by in-situ doping or by doping after deposition. The material of the first conductive channel layers 501 is an N-type semiconductor material formed by doping a group VA element into monocrystalline silicon. The doping concentration at both ends of the first conductive channel layer 501 is greater than the doping concentration in the middle, thereby forming the first doped regions (not marked) and the second doped regions (not marked). In the embodiment, it is described in detail with the second doped regions (not marked) close to the base (not marked) and the first doped regions (not marked) close to the second conductive channel layers 503 as an example, and the embodiment is not limited to this. In other embodiments, the first doped regions may be close to the base and the second doped regions may be close to the second conductive channel layers 503.

Figure 29:
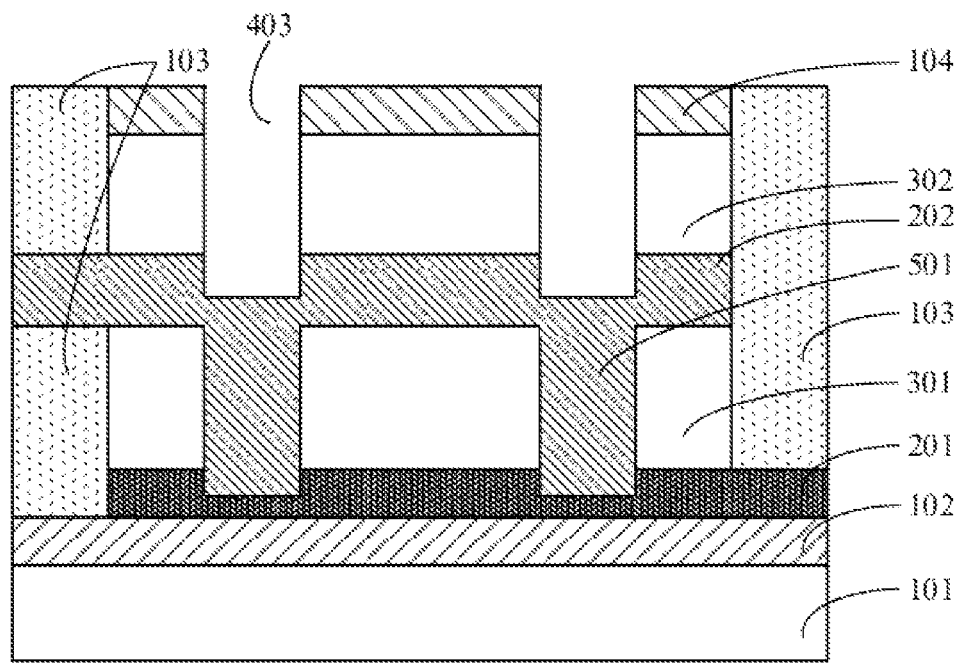

Referring to FIG. 29, a second sacrificial layer 302 and a protective layer 104 are sequentially formed on a base (not marked) of the structural region; and the second sacrificial layer 302 is patterned to form second channels 403 penetrating through the second sacrificial layer 302, and the projections of the first channels 402 and the second channels 403 on the base coincide.

A process of patterning includes, but is not limited to: forming a mask layer on the second sacrificial layer 302, and then patterning the semiconductor structure based on the formed mask layer. In addition, there may be one or more second channels 403 formed by patterning, and multiple openings are discrete arranged on the base (not marked). Referring to FIG. 29, the embodiment is specifically described with four second channels 402 formed in a patterning manner as an example, and the embodiment is not limited to this. In other embodiments, the patterned openings may be one, three, five, or the like. In a specific application, the number of patterned first channels 402 may be specifically set according to requirements. In addition, in the embodiment, the projections of the first channels 402 and the second channels 403 on the base coincide. In other embodiments, the first channels and the second channels may be any arrangement.

Figure 30:
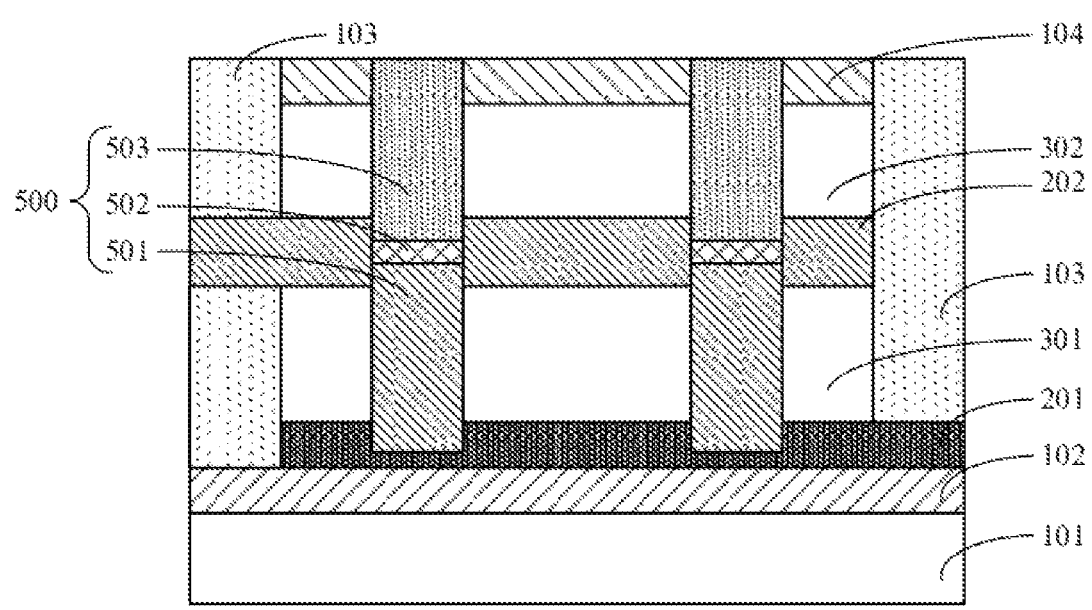

Referring to FIG. 30, conductive buffer layers 502 and second conductive channel layers 503 filling the second channels are formed.

Each of the second conductive channel layers 503 includes a second conductive channel (not marked), and a third doped region (not marked) and a fourth doped region (not marked) respectively at two ends of the first conductive channel (not marked), and the third doped region (not marked) is close to the first conductive channel layer 501.

Specifically, the second conductive channel layers 503 are formed by in-situ doping or by doping after deposition. The material of the second conductive channel layers 503 is a P-type semiconductor material formed by doping a group MA element into monocrystalline silicon. The doping concentration at both ends of the second conductive channel layers 503 is greater than the doping concentration in the middle, thereby forming the third doped regions (not marked) and the fourth doped regions (not marked). In the embodiment, it is described in detail with the fourth doped regions (not marked) away from the base (not marked) and the third doped regions (not marked) close to the first conductive channel layers 501 as an example, and the embodiment is not limited to this. In other embodiments, the third doped regions may be away from the base and the fourth doped regions may be close to the first conductive channel layers 501.

It should be noted that, one of the first conductive channel layer 501 and the second conductive channel layer 503 is an N-type conductive channel, and the other is a P-type conductive channel. In the embodiment, it is described in detail with the first conductive channel layer 501 being an N-type conductive channel and the second conductive channel layer 503 being a P-type conductive channel as an example, and the embodiment is not limited. In other embodiments, the first conductive channel layer 501 may be a P-type conductive channel and the second conductive channel layer 503 may be an N-type conductive channel.

Each of the conductive buffer layers 502 is located between the first conductive channel layer 501 and the second conductive channel layer 503 for reducing electrical interference between the first doped region (not marked) and the third doped region (not marked). In an example, the material of the conductive buffer layer 502 is polycrystalline silicon, and the conductive buffer layer 502 prevents the problem of electrical interference between the first doped region (not marked) and the third doped region (not marked) by reducing a dielectric constant between the first doped region (not marked) and the third doped region (not marked).

Referring to FIGS. 19-21, part of the protective layer 104 is patterned until the second sacrificial layer 302 is exposed, second communicating holes 602 are formed, and the second sacrificial layer 302 is removed based on the communicating holes 602; part of the second conductive layer 202 is patterned until the first sacrificial layer 301 is exposed to form first communicating holes 601, and the first sacrificial layer 301 is removed based on the first communicating holes 601.

A process of patterning includes, but is not limited to: forming a mask layer on the protective layer 104, and then patterning the semiconductor structure based on the formed mask layer.

In the embodiment, the first sacrificial layer 301 and the second sacrificial layer 302 are removed by a wet etching. It is clear to those skilled in the art that with the wet etching, the etching is performed on a certain semiconductor material, while other semiconductor structures are not affected. In addition, in other embodiments, the first sacrificial layer 301 and the second sacrificial layer 302 may be removed by ashing, with which the rate for removing the first sacrificial layer 301 and the second sacrificial layer 302 is high and other semiconductor structures are not affected, either.

Referring to FIGS. 22-24 (referring to FIG. 24 with the base as the first conductive layer), the gate structure 700 filling gaps is formed.

Specifically, the gate structure 700 includes gate oxide layer 702 and metal gate layer 701, the gate oxide layer 702 covers the exposed surfaces of the first conductive channel, the second conductive channel, the first conductive layer 201 (refer to FIGS. 2 and 3) or the isolation layer 102 (refer to FIGS. 4 and 5), and the second conductive layer 202; the metal gate layer 701 is configured to fill gaps between the gate oxide layer 702, thereby forming the gate structure 700.

In an example, to prevent electrical crosstalk problem between the first conductive layer 201 and the second conductive layer 202 and the gate structure 700, forming the semiconductor structure further includes that a first insulation layer (not shown) is formed between the first conductive layer 201 and the gate structure 700; and a second insulation layer (not shown) is formed between the second conductive layer 202 and the gate structure 700.

Referring to FIGS. 1-5 (referring to FIGS. 4 and 5 with the base as the first conductive layer), a first conductive plug 801 electrically connected with the first conductive layer 201, a second conductive plug 802 electrically connected with the second conductive layer 202, third conductive plugs 803 electrically connected with the fourth doped regions (not marked) and a fourth conductive plug 804 electrically connected with the gate structure 700 are formed, specifically as follows.

In the case that the first conductive layer 201 and the substrate 101 are separately arranged, with reference to FIGS. 2 and 3, the first conductive plug 801 penetrates through the peripheral insulation structure 103 and is electrically connected to the first conductive layer 201. Furthermore, the first conductive plug 801 also penetrates through part of the first conductive layer 201 to increase the contact area between the first conductive plug 801 and the first conductive layer 201, thereby reducing the contact resistance between the first conductive plug 801 and the first conductive layer 201.

In the case that the first conductive layer 201 is arranged in the substrate 101, with reference to FIGS. 4 and 5, the first conductive plug 801 penetrates through the peripheral insulation structure 103 and the insulation layer 102 and is electrically connected to the first conductive layer 201 in the substrate 101. Furthermore, the first conductive plug 801 also penetrates through part of substrate 101 and the first conductive layer 201 to increase the contact area between the first conductive plug 801 and the first conductive layer 201, thereby reducing the contact resistance between the first conductive plug 801 and the first conductive layer 201.

The second conductive plug 802 penetrates through part of the peripheral insulation structure 103 and is in contact with the second conductive layer 202. Furthermore, the second conductive plug 802 also penetrates through part of the second conductive layer 202 to increase the contact area between the second conductive plug 802 and the second conductive layer 202, thereby reducing the contact resistance between the second conductive plug 802 and the second conductive layer 202.

The third conductive plugs 803 are in contact with the fourth doped regions (not marked). Furthermore, the third conductive plugs 803 also penetrate through part of the fourth doped regions to increase the contact area between the third conductive plugs 803 and the fourth doped regions (not marked), thereby reducing the contact resistance between the third conductive plugs 803 and the fourth doped regions (not marked).

The fourth conductive plug 804 is in contact with the top of the gate structure 700. Furthermore, the fourth conductive plug 804 also penetrates through part of the gate structure 700 to increase the contact area between the fourth conductive plug 804 and the gate structure 700, thereby reducing the contact resistance between the fourth conductive plug 804 and the gate structure 700.

Compared with the related art, the first conductive channel layer and the second conductive channel layer are vertically arranged, namely, the two conductive channels are vertically arranged, the conductive channels are vertically arranged, and the gate structure surrounds the first conductive channels and the second conductive channels in the horizontal direction, so that the phenomenon that the conductive channels occupy a large area in the horizontal direction is avoided.

The above steps are divided only for clear description. They can be combined into one step or certain steps can be split and divided into multiple steps during implementation. As long as the same logical relation is included; any modification is within the protection scope of the application. An addition of an inconsequential modification or an introduction of an inconsequential design to the flow of the core design but not changing the flow is also within the protection scope of the application.

Since the above-described embodiment corresponds to this embodiment, this embodiment can be implemented in cooperation with the above-described embodiment. The related technical details mentioned in the above-described are applicable in this embodiment, and the technical effects that can be achieved in the above-described embodiment can also be achieved in this embodiment, which are not repeated here in order to reduce repetition. Accordingly, the related technical details mentioned in this embodiment may also be applied in the above-described embodiment.

It can be understood by those of ordinary skill in the art that the embodiments described above are specific embodiments for implementing the disclosure, and in practical applications, various changes in form and detail may be made therein without departing from the spirit and scope of the disclosure.

The invention claimed is:

1. A semiconductor structure, comprising:
   a base, and a conductive channel structure located on the base, wherein the conductive channel structure comprises sequentially stacked a first conductive channel layer, a conductive buffer layer and a second conductive channel layer,
   wherein, the first conductive channel layer comprises a first conductive channel, and a first doped region and a second doped region respectively at two ends of the first conductive channel, and the first doped region is close to the second conductive channel layer,
   the second conductive channel layer comprises a second conductive channel, and a third doped region and a fourth doped region respectively at two ends of the second conductive channel, and the third doped region is close to the first conductive channel layer, and
   the conductive buffer layer is configured to reduce electrical interference between the first doped region and the third doped region;
   a first conductive layer, located on the base and in contact with the second doped region;
   a second conductive layer, nested on the conductive channel structure and in contact with the first doped region and the third doped region; and
   a gate structure, arranged around the first conductive channel the second conductive channel;
   wherein one of the first conductive channel layer or the second conductive channel layer is an N-type conductive channel, and the other is a P-type conductive channel.

2. The semiconductor structure of claim 1, wherein a plurality of the conductive channel structures are discretely arranged on the base;
   the second conductive layer is parallel to a surface of the first conductive layer and is nested on all the conductive channel structures; and in a direction perpendicular to a surface of the base, the second conductive layer is provided with a first communicating hole penetrating through the second conductive layer, and the gate structure further fills the first communicating hole.

3. The semiconductor structure of claim 1, wherein the base comprises a structural region and a connecting line region, the connecting line region is arranged on a periphery of the structural region;

a peripheral insulation structure is arranged on the base in the connecting line region, and the first conductive layer and the second conductive layer further extend into the peripheral insulation structure of the connecting line region on a side; and wherein the semiconductor structure further comprises: a first conductive plug and a second conductive plug, wherein the first conductive plug penetrates through the peripheral insulation structure and is in contact with the first conductive layer; and the second conductive plug penetrates through part of the peripheral insulation structure and is in contact with the second conductive layer.

4. The semiconductor structure of claim 3, wherein,
the first conductive layer extends into the peripheral insulation structure at a first side of the connecting line region;

the second conductive layer extends into the peripheral insulation structure at a second side of the connecting line region; and the first side and the second side of the connecting line region are located at different sides of the structural region.

5. The semiconductor structure of claim 3, further comprising:

a third conductive plug, in contact with the fourth doped region; and a fourth conductive plug, in contact with a top of the gate structure.

6. The semiconductor structure of claim 1, wherein,
a position of a contact surface of the conductive buffer layer and the first doped region is lower than a central thickness position of the second conductive layer and is higher than a position of a bottom surface of the second conductive layer; and a position of a contact surface of the conductive buffer layer and the third doped region is higher than the central thickness position of the second conductive layer and is lower than the position of the bottom surface of the second conductive layer.

7. The semiconductor structure of claim 6, wherein a thickness of the conductive buffer layer is smaller than ⅓ of a thickness of the second conductive layer.

8. The semiconductor structure of claim 1, wherein the base comprises a substrate and an isolation layer, the first conductive layer is located in the substrate, the isolation layer is located on a top surface of the substrate, and the first conductive channel layer penetrates through the isolation layer and part of the substrate, so that the second doped region is in contact with the first conductive layer.

9. The semiconductor structure of claim 1, wherein the base comprises a substrate and an isolation layer, the isolation layer is located on a top surface of the substrate, and the first conductive layer is located on a top surface of the isolation layer.

10. The semiconductor structure of claim 9, further comprising: a first insulating layer located between the first conductive layer and the gate structure.

11. The semiconductor structure of claim 1, further comprising: a second insulating layer located between the second conductive layer and the gate structure.

12. The semiconductor structure of claim 2, further comprising: a protective layer, nested on top portions of all the conductive channel structures and in contact with the fourth doped region of each of the conductive channel structures, the protective layer has second communicating holes therethrough in the direction perpendicular to the surface of the base, projections of the first communicating hole of each of the conductive channel structures and the second communicating holes on the base coincide, and the gate structure also fills the second communicating holes.

13. The semiconductor structure of claim 12, wherein a top surface of the protective layer is flush with a top surface of the second conductive channel layer of each of the conductive channel structures.

14. A method for forming a semiconductor structure, comprising:

providing a base comprising a structural region and a connecting line region, and the base comprises a substrate, a first conductive layer, and an isolation layer;

forming a first sacrificial layer on the base in the structural region, and forming a peripheral insulation structure on the base in the connecting line region;

patterning the first sacrificial layer to form a first channel penetrating through the first sacrificial layer;

forming a second conductive layer filling the first channel and covering the first sacrificial layer, wherein the second conductive layer extends into the peripheral insulation structure of the connecting line region;

sequentially forming a second sacrificial layer and a protective layer on the base of the structural region;

patterning the second sacrificial layer to form a second channel penetrating through the second sacrificial layer, and projections of the first channel and the second channel on the base coincide;

forming a second conductive channel layer filling the second channel;

patterning part of the protective layer until the second sacrificial layer is exposed, and removing the second sacrificial layer;

patterning part of the second conductive layer until the first sacrificial layer is exposed, and removing the first sacrificial layer; and forming a gate structure filling gaps.

15. The method for forming the semiconductor structure of claim 14, wherein providing the base comprising the structural region and the connecting line region comprises: providing a substrate comprising the structural region and the connecting line region, forming the isolation layer on the base of the structural region, and forming the first conductive layer on the isolation layer.

16. The method for forming the semiconductor structure of claim 14, wherein providing the base comprising the structural region and the connecting line region comprises: providing a substrate comprising the structural region and the connecting line region, forming the first conductive layer on the base of the structural region by doping, and forming the isolation layer on the substrate of the structural region.

17. A method for forming a semiconductor structure, comprising:
- providing a base comprising a structural region and a connecting line region, wherein the base comprises a substrate, a first conductive layer and an isolation layer;
- forming a first sacrificial layer on the base in the structural region, and forming a peripheral insulation structure on the base in the connecting line region;
- forming a second conductive layer on the first sacrificial layer, wherein the second conductive layer extends into the peripheral insulation structure of the connecting line region;
- sequentially forming a second sacrificial layer and a protective layer on the base in the structural region;
- patterning the protective layer, the second sacrificial layer, the second conductive layer and the first sacrificial layer to form an opening, and filling the opening to form a conductive channel structure;
- patterning part of the protective layer until the second sacrificial layer is exposed, and removing the second sacrificial layer;
- patterning part of the second conductive layer until the first sacrificial layer is exposed, and removing the first sacrificial layer; and
- forming a gate structure filling gaps.

18. The method for forming the semiconductor structure of claim 17, wherein providing the base comprising the structural region and the connecting line region comprises: providing the substrate comprising the structural region and the connecting line region, forming the isolation layer on the substrate in the structural region, and forming the first conductive layer on the isolation layer.

19. The method for forming the semiconductor structure of claim 17, wherein providing the base comprising the structural region and the connecting line region comprises: providing the substrate comprising the structural region and the connecting line region, forming the first conductive layer on the substrate in the structural region, and forming the isolation layer on the substrate in the structural region.

* * * * *